United States Patent
Bossard et al.

(10) Patent No.: US 11,790,122 B2
(45) Date of Patent: Oct. 17, 2023

(54) PREDICTIVE VECTOR GUIDE FOR CONSTRUCTION COST ESTIMATION

(71) Applicant: eTakeoff LLC, Lafayette, CO (US)

(72) Inventors: Mark A. Bossard, Anthem, AZ (US); David L. Snedaker, Monument, CO (US); Matthew W. Spaulding, Salida, CO (US)

(73) Assignee: ETAKEOFF, LLC., Lafayette, CO (US)

( * ) Notice: Subject to any disclaimer, the term of this patent is extended or adjusted under 35 U.S.C. 154(b) by 0 days.

(21) Appl. No.: 17/452,894

(22) Filed: Oct. 29, 2021

(65) Prior Publication Data
US 2022/0138361 A1 May 5, 2022

Related U.S. Application Data

(60) Provisional application No. 63/108,680, filed on Nov. 2, 2020.

(51) Int. Cl.
*G06F 30/12* (2020.01)
*G06Q 10/0631* (2023.01)
*G06F 30/13* (2020.01)
*G06F 3/04812* (2022.01)

(52) U.S. Cl.
CPC .......... *G06F 30/12* (2020.01); *G06F 3/04812* (2013.01); *G06F 30/13* (2020.01); *G06Q 10/06313* (2013.01)

(58) Field of Classification Search
CPC ...... G06F 30/12; G06F 30/13; G06F 3/04812; G06Q 10/06313
See application file for complete search history.

(56) References Cited

U.S. PATENT DOCUMENTS

| | | | |
|---|---|---|---|
| 8,416,237 B1* | 4/2013 | Jain | G06T 19/00 345/420 |
| 9,465,894 B1* | 10/2016 | Lorono | G06T 19/00 |
| 10,790,056 B1* | 9/2020 | Accomazzi | G06T 7/0002 |
| 11,250,607 B1* | 2/2022 | Jain | G06T 11/203 |
| 2004/0017404 A1* | 1/2004 | Schileru-Key | G06F 3/04815 715/854 |
| 2012/0026100 A1* | 2/2012 | Migos | G06F 3/0412 345/173 |

(Continued)

OTHER PUBLICATIONS

Snap modes, Oct. 20, 2019, Manifold Software Limited, pp. 1-12 (retrieved through waybackmachine) (Year: 2019).*

(Continued)

*Primary Examiner* — Justin S Lee
(74) *Attorney, Agent, or Firm* — Martensen IP; Michael C. Martensen

(57) ABSTRACT

A system and associated methodology for predictive construction cost estimation. Path data, extracted from a vector-based data source, is decoded and correlated into a point-map-to-line-segment array providing the ability to predictively snap a cursor on a user interface to points and/or line segments illustrated in the vector-based data source. Once identified and committed to by the user, the invention thereafter links additional snapped points/line segments/polylines enabling the user to quickly and efficient move throughout the data source crating a timely and accurate construction estimation.

30 Claims, 14 Drawing Sheets

(56) References Cited

U.S. PATENT DOCUMENTS

| | | | | |
|---|---|---|---|---|
| 2014/0033132 | A1* | 1/2014 | Jain | G06F 3/04812 |
| | | | | 715/862 |
| 2015/0062033 | A1* | 3/2015 | Ishihara | G06F 3/017 |
| | | | | 345/173 |
| 2015/0220242 | A1* | 8/2015 | Guest | H04L 41/22 |
| | | | | 715/740 |
| 2017/0068418 | A1* | 3/2017 | Tanaka | G06F 3/0488 |
| 2019/0095549 | A1* | 3/2019 | De Keyser | G06F 30/00 |
| 2019/0377472 | A1* | 12/2019 | Naylor | G06F 3/04842 |
| 2020/0007841 | A1* | 1/2020 | Sedeffow | G06T 7/70 |
| 2020/0089819 | A1* | 3/2020 | Gauderis | G06T 17/10 |
| 2020/0142568 | A1* | 5/2020 | Koetter | G06F 3/04842 |
| 2021/0240332 | A1* | 8/2021 | Walkin | G06F 3/0489 |
| 2022/0108505 | A1* | 4/2022 | Dhanuka | G06T 7/13 |

OTHER PUBLICATIONS

Charl van der Merwe, AutoCAD Snapping in Layout/Paperspace, Jun. 6, 2020, Micro Graphics, pp. 1-6 (Year: 2020).*

* cited by examiner

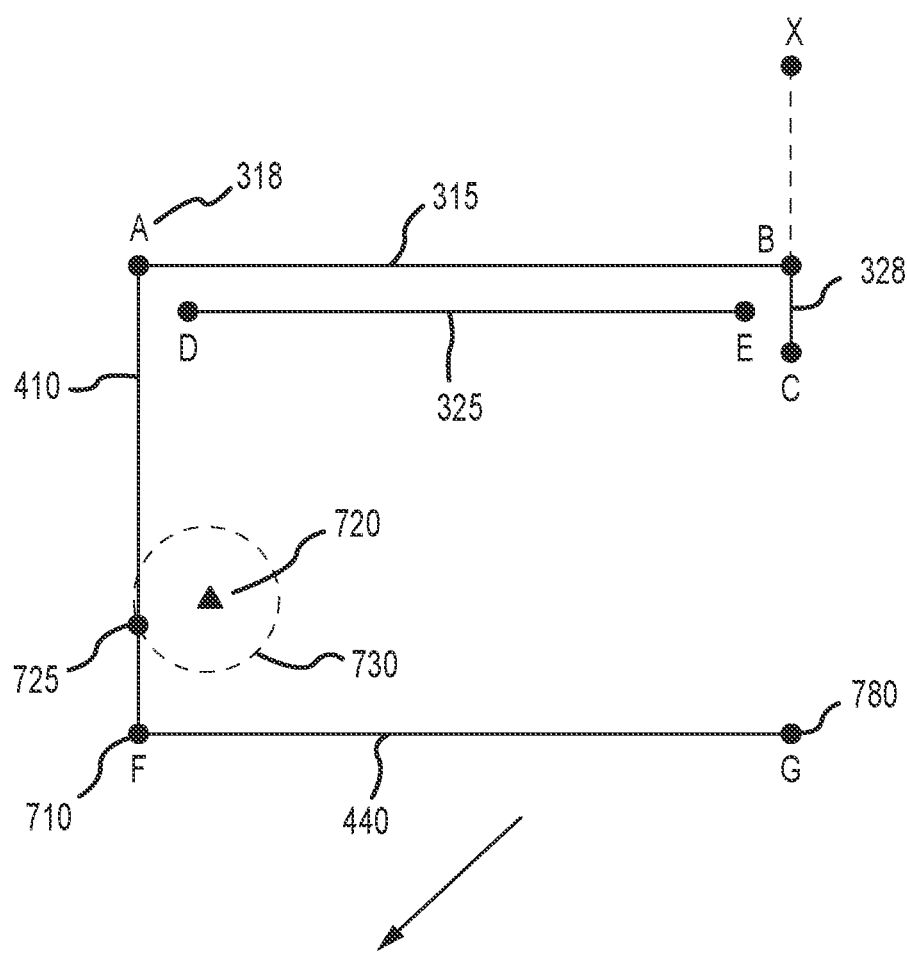
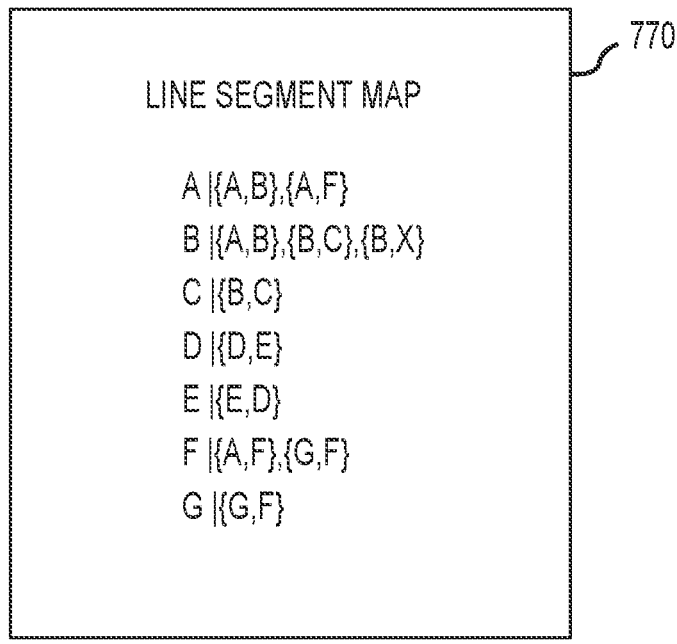
FIG.7

PREDICTIVE VECTOR GUIDE FOR CONSTRUCTION COST ESTIMATION

RELATED APPLICATION

The present application relates to and claims the benefit of priority to U.S. Provisional Patent Application No. 63/108,680 filed 2 Nov. 2020 which is hereby incorporated by reference in its entirety for all purposes as if fully set forth herein.

BACKGROUND OF THE INVENTION

Field of the Invention

Embodiments of the present invention relate, in general, to construction cost prediction and more particularly to a vector-based data predictive system for construction cost estimation.

Relevant Background

Construction estimation takeoffs are a crucial component of any construction project. In its most essential form, a takeoff is a count of how much material will be required to complete a project. It can include how many studs, joints, light fixtures or feet of cable is needed to complete the job to the specifications provided. An accurate takeoff gives both the client and contractor a firm outline of the total material cost for a project. Depending on the size and scope of the project, construction takeoffs can vary from relatively simple to incredibly complex.

At its core, the construction takeoff's purpose is to give the estimator a breakdown of all of the components required to complete a construction project. It does not matter if it is a new project or a renovation since both will require a construction takeoff. In order to create a construction material takeoff, an estimator will need to quantify every single component required to complete their project. Construction takeoffs include all of the raw materials needed for the project, such as wood, rebar, piping, and concrete. Each of these materials is quantified, and a price is assigned to each. These two steps are usually done separately, with the estimator first creating a quantity takeoff list and then assigning a price to each material.

In order to create effective construction takeoff, it must be accurate. Estimators must ensure that their material quantification is comprehensive, meaning it covers all of the materials that will be required to complete a job. However, creating a comprehensive construction takeoff can be extremely time-consuming if done by hand. In order to create a construction takeoff, the estimator must understand how to read blueprints and draw item quantities from the outline.

Manual construction takeoffs have existed, in one form or another, since the earliest construction projects were commissioned. In a manual takeoff the estimator or contractor will read the blueprint, list each component required including the type of material along with important considerations such as length, volume, or area of the material. Once each material has been quantified, the estimator then has to assign a price to each by hand and then calculate a final material total.

There are a couple of downsides to manual construction takeoffs. The first is that they can be extremely time-consuming depending on the complexity of the project. Second, manual construction takeoffs are prone to errors. Materials can be miscounted, counted twice, or not included at all, and fundamental measurements may be inaccurate. It is much easier to miss errors in a construction takeoff when completing it by hand. Third, manual construction takeoffs require a high degree of skill to complete in order to be accurate.

In contrast to a manual takeoff, digital takeoffs offer a number of benefits. A digital takeoff is a takeoff completed in a construction cost estimating software platform that offers takeoff capability. Unfortunately, not all construction cost estimating software can help the contractor perform a digital takeoff. A digital takeoff automates many of the more complicated aspects of the construction takeoff process, but the features associated with a digital takeoff vary depending on the platform. Some digital takeoff software gives the user the ability to upload a blueprint directly into the software suite. From this blueprint, the software can pull a comprehensive list of all material requirements for the project. From there, a contractor or estimator can make any adjustments, such as increasing the number of materials required for the project manually so as to account for material waste.

Many estimators have cut their manual takeoff time in half just by changing to electronic takeoff software. With an electronic takeoff, estimators can more easily get quantities and dimensions directly off electronic construction drawings. While the electronic format of documents may vary, by far the most common format is a 2-D vector-based Portable Document Forman (PDF) that designers export from their Computer Aided Design (CAD) systems. Unlike 2-D raster PDFs, which are merely scanned images turned into a PDF, a vector-based PDF contains data (such as dimensions) that can be extracted. But even with the streamlining benefits that electronic takeoff has over manual takeoff, working with a vector-based data source still has its challenges. Gaining dimensions from the vector-based data usually requires the estimator to zoom in and click on the end points of every line in the drawing. To takeoff dimensions for a roof, for example, the estimator must click on every corner and every facet of the roof.

Another challenge of the current state of the art is that the estimator may not identify a line's exact endpoint, causing the measurements to be inaccurate—which affects overall estimate accuracy. Recently, the industry has seen the advent of various levels of "snap" technology introduced into vector-based takeoff software. Snap is a feature common in CAD applications in which the cursor can automatically "snap" to an existing point on a line in the drawing. This eliminates the need for the estimator to spend the time zooming into the drawing to find the most accurate corner or endpoint by hand. At first this may appear to be a benefit. But as estimators begin to use the technology in takeoff software, they quickly see the shortcomings of current snap technology.

The primary problem is that the process used to create the vector-based data is instrumental in how successfully the snap technology can be used. Many snap takeoff demonstrations use a very specially created PDF or vector-based drawing to best "show off" the technology. However, in the real world, the architect or author of the plan does not create the lines and points on a design in a logical manner that benefits the estimator, or more accurately, the estimator's software. As a result, the practical application of current snap technology is so cumbersome as to become useless.

No architect creates their vector-based designs to suit a specific software product, nor are they apt to spend any extra time carefully considering how they prepare the drawing for an estimator's use. Hence, most of these complex drawings have so many extraneous points, line intersections and hidden layers separating data, that using current snap technology to "snap to" the right points or lines is actually slower than simply doing the takeoff manually. And while much is made of "polylines" to identify entire wall sections, etc., the actual percentage of reliably drawn (useful) polylines in vector-based PDFs is very low.

The construction estimator of today finds that using current snap technology with very complex drawings is so hit and miss they eventually stop using it altogether. Accordingly, a need exists for a predictive "snap" technology that reliably integrates with a wide variety of an architect's vector-based data design and predictably snaps to points and lines to aid, rather than hinder, the estimator. These and other deficiencies of the prior art are addressed by one or more embodiments of the present invention.

Additional advantages and novel features of this invention shall be set forth in part in the description that follows, and in part will become apparent to those skilled in the art upon examination of the following specification or may be learned by the practice of the invention. The advantages of the invention may be realized and attained by means of the instrumentalities, combinations, compositions, and methods particularly pointed out in the appended claims.

SUMMARY OF THE INVENTION

The present invention gathers, decodes and correlates path data found in vector based data files (documents) enabling a user to quickly and efficiently creates a construction takeoff estimate. According to one embodiment of the present, a computer implemented method for predictive vector based construction cost estimation includes accessing, for a plurality of objects, vector-based data available for display on a user interface. Such vector-based data includes path data for each of the plurality of objects. The method continues by determining a cursor location of a cursor within the vector-based data on the user interface with the understanding that the cursor includes a sense area encompassing the cursor location. Path data is collected thereafter with respect to each respective object forming a point-map-to-line-segment array. The point-map-to-line-segment array identifies one or more points and one or more line segments associated with each point and wherein each line segment includes two end points. The method thereafter identifies a current best point-on-line based on proximity of the cursor location to a locus of points associated with one of the one or more line segments; and, using the data collected above, snaps the cursor to a position on the user interface based on a selected mode of operation.

Another feature of invention is identifying a candidate best point-on-line associated with a candidate line segment within the sense area. This identification is based on a comparison of the proximity of the cursor location to the candidate best point-on-line and the proximity of the cursor location to the current best point-on-line. When the proximity of the cursor location to the candidate best point-on-line is less than proximity of the cursor location to the current best point-on-line, the current best point-on-line is replaced with the candidate best point-on-line. Also from the current best point-on-line the invention can determine a best line segment.

Other features of the methodology described above include snapping the cursor to the current best point-on-line when the selected mode of operation is point snap mode. Similarly, responsive to the selected mode of operation being line snap mode, the cursor is snapped to an endpoint of the line segment associated with the current best point-on-line.

Objects contained within the vector based data are commonly associated with bounding boxes. One feature of the present invention is identifying one or more bounding boxes surrounding the cursor based on the cursor location gaining object path data recognizing that one or more points of each object is an end point.

The invention further stores current best point-on-line in a snap point collection array for later use as well as identifies a snap end point closest to the current best point-on-line from the two end points of the line segment associated with the current best point-on-line. The two end points of the line segment associated with the current best point-on-line are ordered and the snap end point is stored in a snap point collection array. The method additional retrieves, from the point-map-to-line-segment array, end points of other line segments associated with the snap end point and predicts a next end point based on proximity of the cursor location with end points of other line segments as associated with the snap end point. With this information in hand the invention continues by snapping the cursor on the user interface to the next end point, linking the next end point and its associated line segment to the snap end point and storing the next end point and both end points of the associated line segment in the snap point collection array.

In other version of the present invention, and responsive to committing to the current best point-on-line, the invention includes the step of snapping the cursor to the current best point-on-line and storing the current best point-on-line, and both end points of the associated line segment in a snap point collection array.

In another embodiment, the methodology described above is embodied on a non-transitory computer-readable storage medium in the form of instructions that, when executed by at least one computing device cause to device to access, for a plurality of objects, vector-based data available for display on a user interface, wherein the vector-based data includes path data for each of the plurality of objects. The device can then determine a cursor location of a cursor within the vector-based data on the user interface wherein the cursor includes a sense area encompassing the cursor location, collect path data of each respective object and form a point-map-to-line-segment array from collected path data of each respective object. The point-map-to-line-segment array identifies one or more points and one or more line segments associated with each point and each line segment includes two end points. The device can thereafter identify a current best point-on-line based on proximity of the cursor location to a locus of points associated with one of the one or more line segments and snap the cursor to a position on the user interface based on a selected mode of operation.

The computer instructions can also cause the computing device to identify a candidate best point-on-line associated with one or more line segments within the sense area based on a comparison of proximity of the cursor location to the candidate best point-on-line and proximity of the cursor location to a current best point-on-line, and responsive to proximity of the cursor location to the candidate best point-on-line being less than proximity of the cursor location to the current best point-on-line, replace the current best point-on-line with the candidate best point-on-line.

In other embodiments the instructions can cause the computing device to identify a snap end point closest to the current best point-on-line from the two end points of the line segment associated with the current best point-on-line and order the two end points of the line segment associated with the current best point-on-line and store the snap end point in a snap point collection array. The instructions can further cause the device to retrieve, from the point-map-to-line-segment array, end points of other line segments associated with the snap end point and thereafter predict a next end point based on proximity of the cursor location with end points of other line segments associated with the snap end point. The prediction enables the device to snap the cursor on the user interface to the next end point, link the next end point and its associated line segment to the snap end point and store the next end point and both end points of the associated line segment in the snap point collection array.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein:

FIG. 7 provides a more illustrative and real world example of the point-map-to-line-segment array of the present invention;

Figure 1:
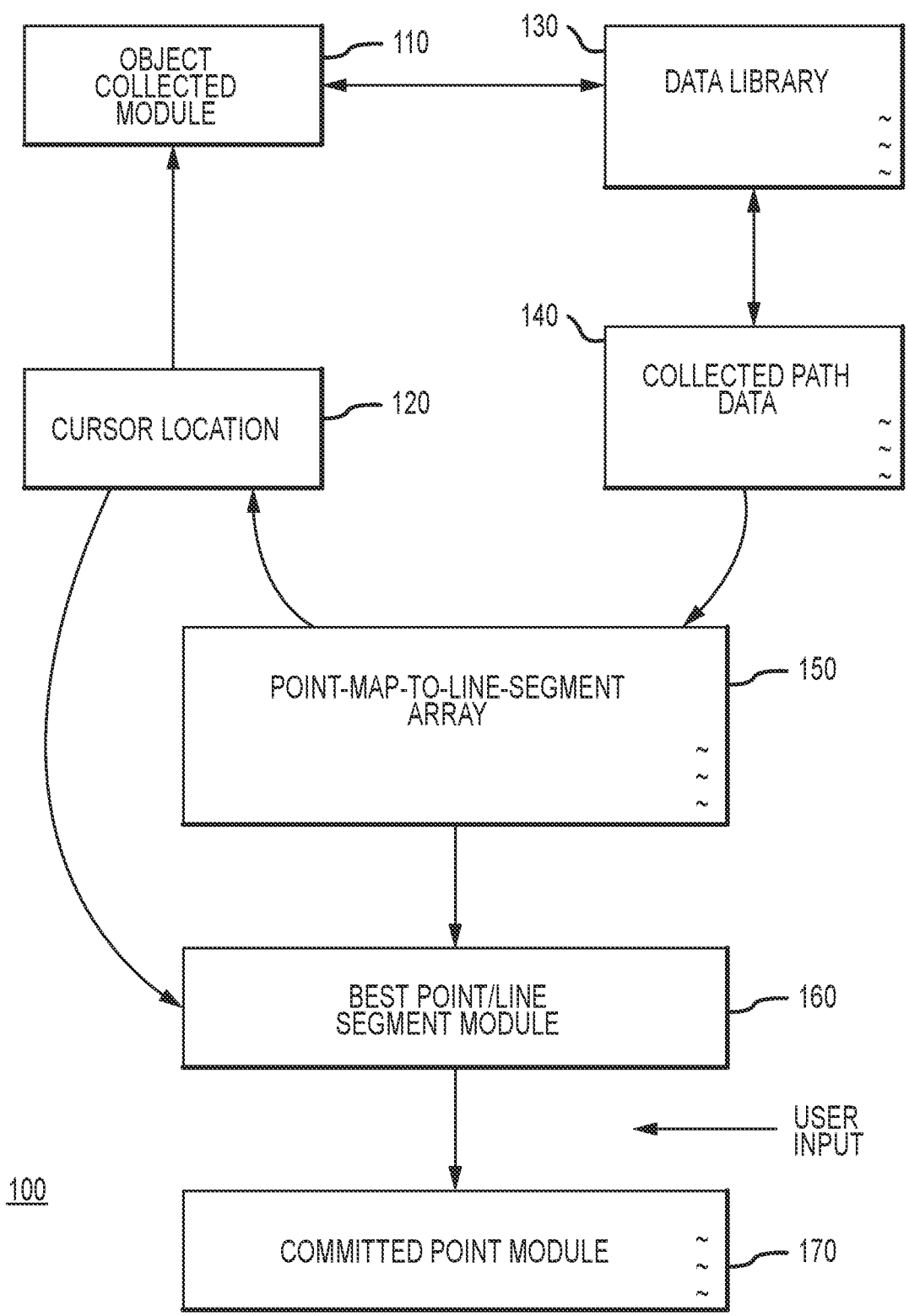
FIG. 1 presents a high-level architecture of a system for construction cost estimation according to an embodiment of the present invention.

The Figures depict embodiments of the present invention for purposes of illustration only. One skilled in the art will readily recognize from the following discussion that alternative embodiments of the structures and methods illustrated herein may be employed without departing from the principles of the invention described herein.

DESCRIPTION OF THE INVENTION

The present invention's "predictive snap" technology provides added intelligence to vector-based data such as that found in PDF documents. Various versions of the present invention are path data "aware" meaning that there is no need to specially format or prepare PDF documents. The present invention detects a user's movement as they conduct measurement point selection e.g. proximate vs. clockwise rotation vs counterclockwise rotation, with respect to sensed line segments and specifically to a sensed point-on-line. The estimation tool of the present invention snaps (repositions) the user's cursor to a point, line, or set of logical connected lines (polylines) based on logical interpretations of the construction estimation process, and the ability to seamlessly pick between what attribute the user is seeking.

Path data, extracted from a vector-based data source, is decoded and correlated into a point-map-to-line-segment array providing the ability to predictively snap a cursor on a user interface to points and/or line segments illustrated in the vector-based data source. Once identified and committed to by the user, the invention thereafter links additional snapped points/line segments/polylines enabling the user to quickly and efficient move throughout the data source creating a timely and accurate construction estimation.

Embodiments of the present invention are hereafter described in detail with reference to the accompanying Figures. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Like numbers refer to like elements throughout. In the figures, the sizes of certain lines, layers, components, elements or features may be exaggerated for clarity.

The terminology used herein is for the purpose of describing particular embodiments only and is not intended to be limiting of the invention. As used herein, the singular forms "a," "an" and "the" are intended to include the plural forms as well, unless the context clearly indicates otherwise. Thus, for example, reference to "a component surface" includes reference to one or more of such surfaces.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be also understood that when an element is referred to as being "on," "attached" to, "connected" to, "coupled" with, "contacting", "mounted" etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of a device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

Included in the description are flowcharts depicting examples of the methodology which may be used to provide a vector-based data predictive system for construction cost estimation. In the following description, it will be understood that each block of the flowchart illustrations, and combinations of blocks in the flowchart illustrations, can be implemented by computer program instructions. These computer program instructions may be loaded onto a computer or other programmable apparatus to produce a machine such that the instructions that execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The computer program instructions may also be loaded onto a computer or other programmable apparatus to cause a series of operational steps to be performed in the computer or on the other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve the manipulation of information elements. Typically, but not necessarily, such elements may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," "words", or the like. These specific words, however, are merely convenient labels and are to be associated with appropriate information elements.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

The present invention predicts user action to aid in the repositioning or snapping of a user's cursor during a construction estimation effort. As one of reasonable skill in the relevant art would appreciate, in conducting a construction takeoff a contractor must assess a set of architectural plans to provide a cost and material estimate. Fundamental to gaining an accurate estimate is determining the scope of the effort and needed material. From a design drawing, provided by an architect or the like, the contractor identifies volumes, surface area, lengths of rooms, etc. by capturing data. The present invention enables a user to assess vector-based data using a tool that interprets the user's actions and repositions the cursor to the next logical point, line, or set of lines. The result is a significant savings in the estimator time and effort combined with more accurate estimations.

FIG. 1 presents a high-level architecture of a system 100 for construction cost estimation according to an embodiment of the present invention. Upon access to a vector-based document such as a PDF or the like, an object collection module 110 identifies objects contained within the document based on the location of a user control cursor on a user interface. Each object, which may be a collection of lines and/or points, is, in one embodiment, associated with a bounding box. Upon the cursor's location 120 being encompassed by a bounding box the object collection module 110 identifies object(s) associated with that bounding box and gains object path data from a data library 130.

The collected path data 140 is decoded and correlated forming a point-map-to-line-segment array 150. Using information from point-map-to-line-segment array 150 and cursor location 120, a best point and/or line segment module 160 predicts the next logical position of the cursor and snaps the cursor to that location, simplifying user workload and aiding in an accurate cost estimate. The best point/line segment module 160 passes its prediction to a committed point/segment module 170 that, with user input, links predicted points and line segments with subsequent cursor movement, thereby enabling a user to quickly outline or trace an area of interest with agility, speed and accuracy.

As introduced above, the present invention begins with collecting path data 140 through the object collection module 110. Vector-based data found in documents are an amalgamation of objects that, when combined, depict a design or architectural document. While vector-based data can be found in a variety of forms, it is most commonly associated with vector-based documents. Objects within vector-based documents are rarely organized with any human recognizable pattern. Moreover, a single object can be comprised of a single point or line or be a grouping of several points and/or lines.

By convention each object, or group of objects, within a vector base document is typically bounded by a bounding box. A bounding box is the minimum or smallest bounding or enclosing box for a point set (S) in N dimensions. It is the box with the smallest measure (area, volume, or hypervolume in higher dimensions) within which all the points lie. When other kinds of measure are used, the minimum box is usually called accordingly, e.g., "minimum-perimeter bounding box." The term box comes from its usage in the Cartesian coordinate system, where it is indeed visualized as a rectangle (two-dimensional case), rectangular parallelepiped (three-dimensional case), etc.

Figure 2:
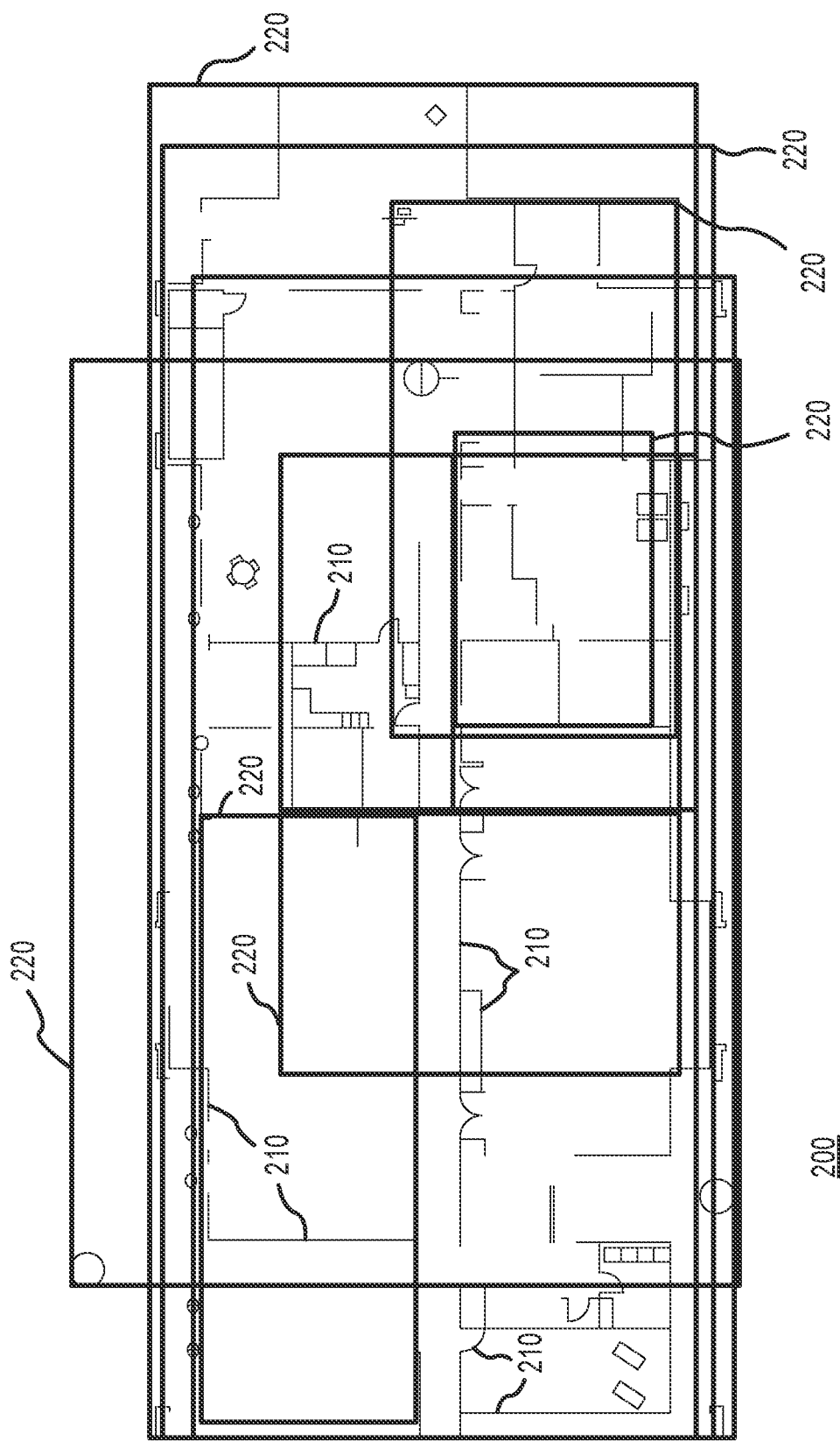
FIG. 2 is a representative vector-based design document/architectural drawing comprised of a plurality of objects as accessed by one embodiment of the present invention.

FIG. 2 is a representative vector-based design document 200 or architectural drawing comprised of a plurality of objects 210. Superimposed on top of the vector-based design document are a plurality of bounding boxes 220, one for each object 210 in the drawing. In this instance, and according to embodiment of the present invention, the location of the cursor determines which objects are of interest and accordingly, which objects' path data are collected. As the user moves the cursor throughout the document, the number of bounding boxes that encompass the cursor changes. The present invention collects and stores path data with respect to those objects associated with bounding boxes encompassed by the cursor in real time. And while the cursor may move to leave a bounding box, information previously gained is retained. In that manner the collected path data is an aggregation of object path data based on the users' historical movement of the cursor. One of reasonable skill in the relevant art will appreciate that path data may be gained through a variety of sources. In this example objects are identified based on their bounding boxes, from which path data is extracted. In other embodiments path data of objects is retrieved using different mechanisms or supplied directly for analysis, decoding and correlation. While use of bounding boxes is common, it should not be viewed as a sole source of path data.

Figure 3:
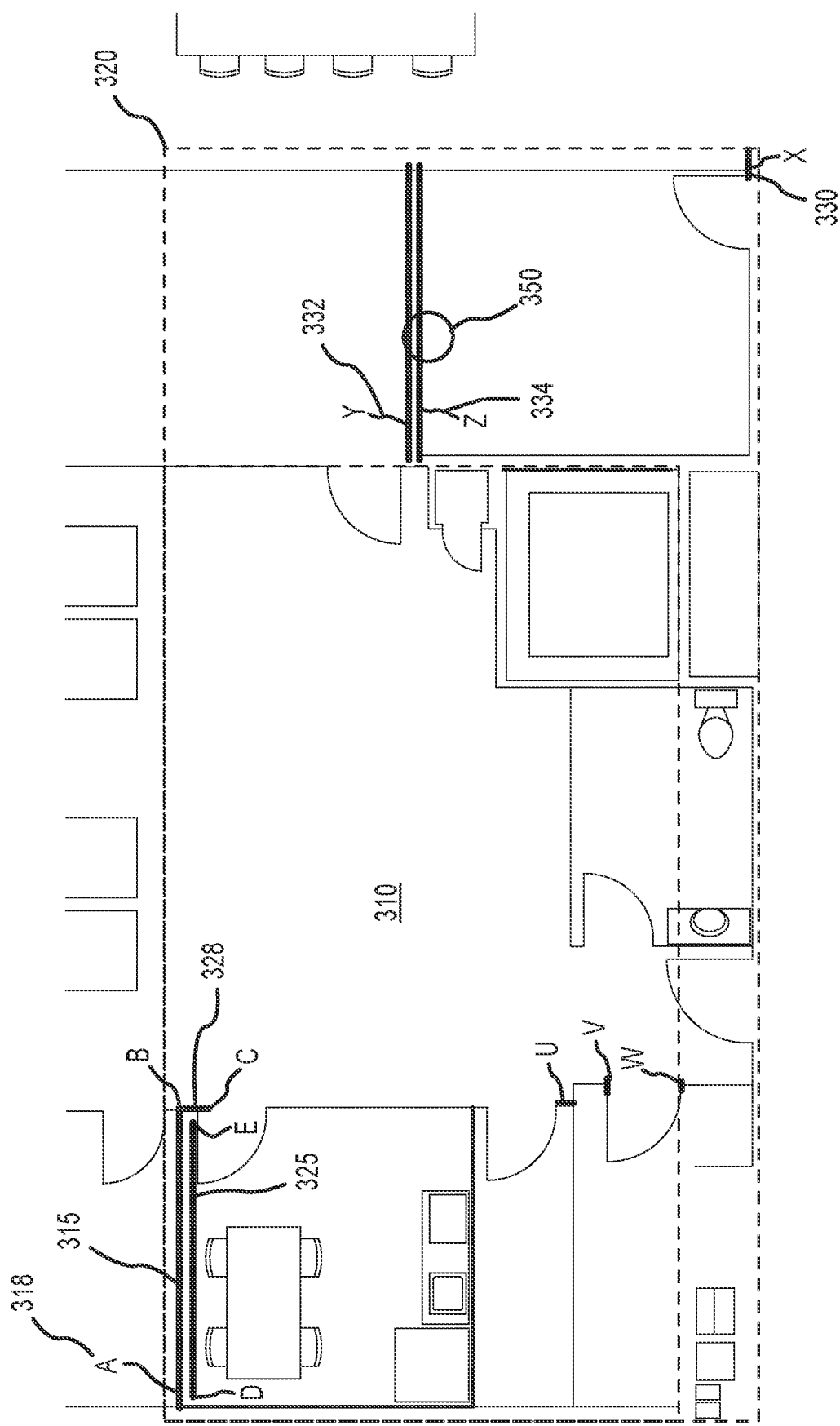
FIG. 3 illustrates a vector-based data source and the collection of path data based on cursor movement according to one embodiment of the present invention.

To better illustrate the process of the present invention outlined above, consider the simplified vector-based document of FIG. 3. FIG. 3 illustrates the collection of path data based on cursor movement according to one embodiment of the present invention. The underlying image of FIG. 3 is a vector-based design document 310 comprised of a plurality of objects. In this depiction a single object is comprised of nine (9) lines segments. Of the nine (9) line segments, three (3) are located in the upper left-hand corner of the design document. They include line segments AB 315, BC 328 and DE 325. The endpoint of line segment AB 315, point A 318 in this case, forms the upper left corner of a bounding box 320. Line segment X 330 forms the lower right-hand corner of the bounding box 320. In addition to line segments AB, BC, and DE, line segments U, V, W, X, Y and Z are encompassed by the rectangular bounding box. (Note for simplicity line segments U, V, W, X, Y and Z are referred to as singular elements rather than having end points. Each includes two connected endpoints forming a line.) These nine elements are encompassed within the rectangular bounding box 320 that is overlaid on top of the vector-based design document 310.

The sense circle surrounding the cursor 350 is found on the right-hand side of the document near line segments Y 332 and Z 334. As illustrated, the cursor is encompassed by the bonding box 320 and thus, according to one embodiment of the present invention, the object path data is collected and analyzed. In this case, the information or path data with respect align segment AB, BC, DE, U, V, W, X, Y and Z are collected from the data library, passed to the data collection module, and stored in a collected path data library.

Figure 4:
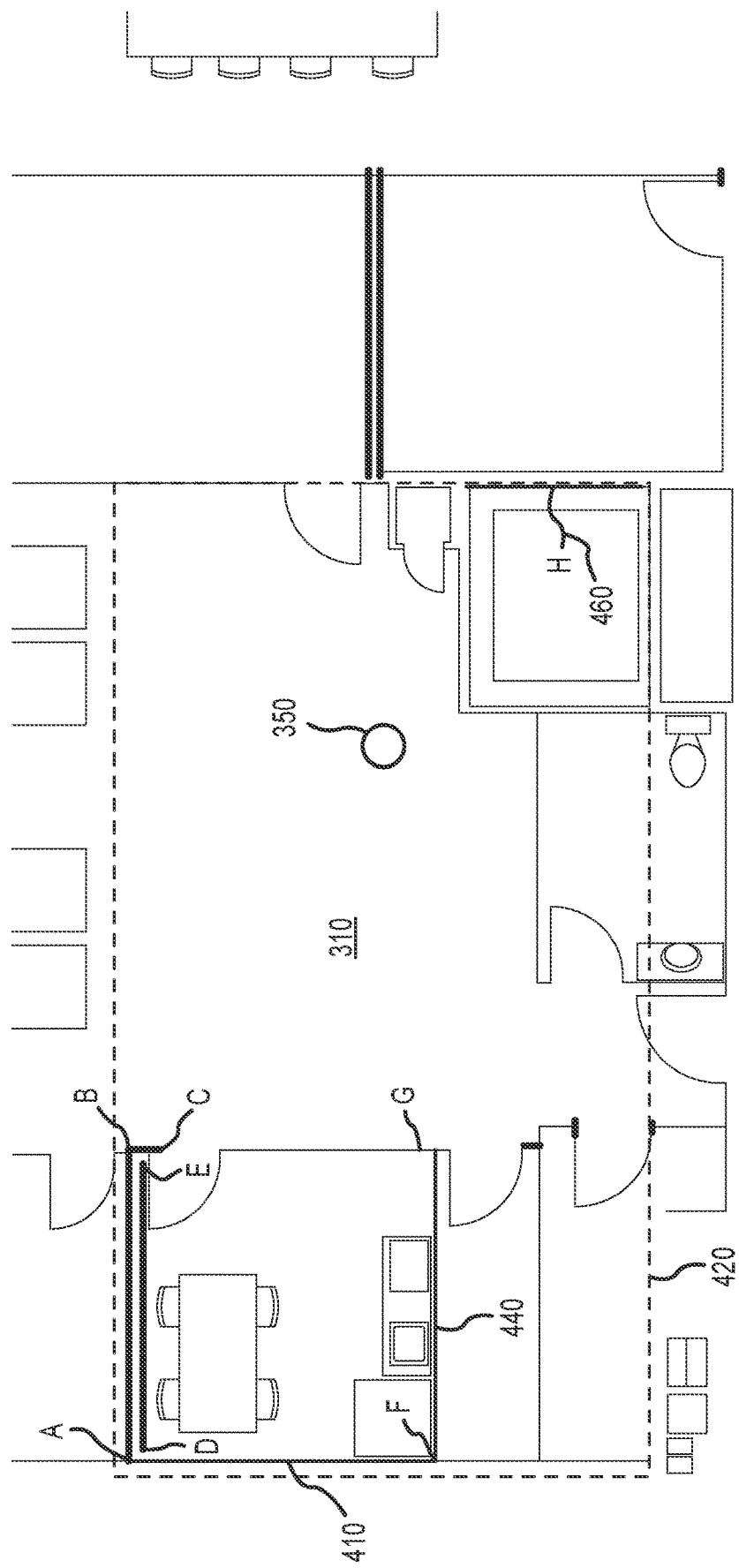
FIG. 4 presents the collection and correlation of additional path data from the vector-based data source of FIG. 3.

FIG. 4 depicts the same portion of the vector-based design document 310 shown in FIG. 3 with the addition of one or more additional objects. As the cursor 350 is moved from right to left, while remaining within the original bounding box, it enters and is encompassed by an additional bounding box 420 associated with a new object. Line segments AF 410, FG 440 and H 460 represent a different object having a unique bounding box 420. As the cursor is encompassed by the new bonding box and according to one embodiment of the present invention, the object path data is collected and analyzed. In this instance information or path data with respect align segment AF, FG and H are collected from the data library and passed to the data collection module and added to the collected path data library.

Figure 5:
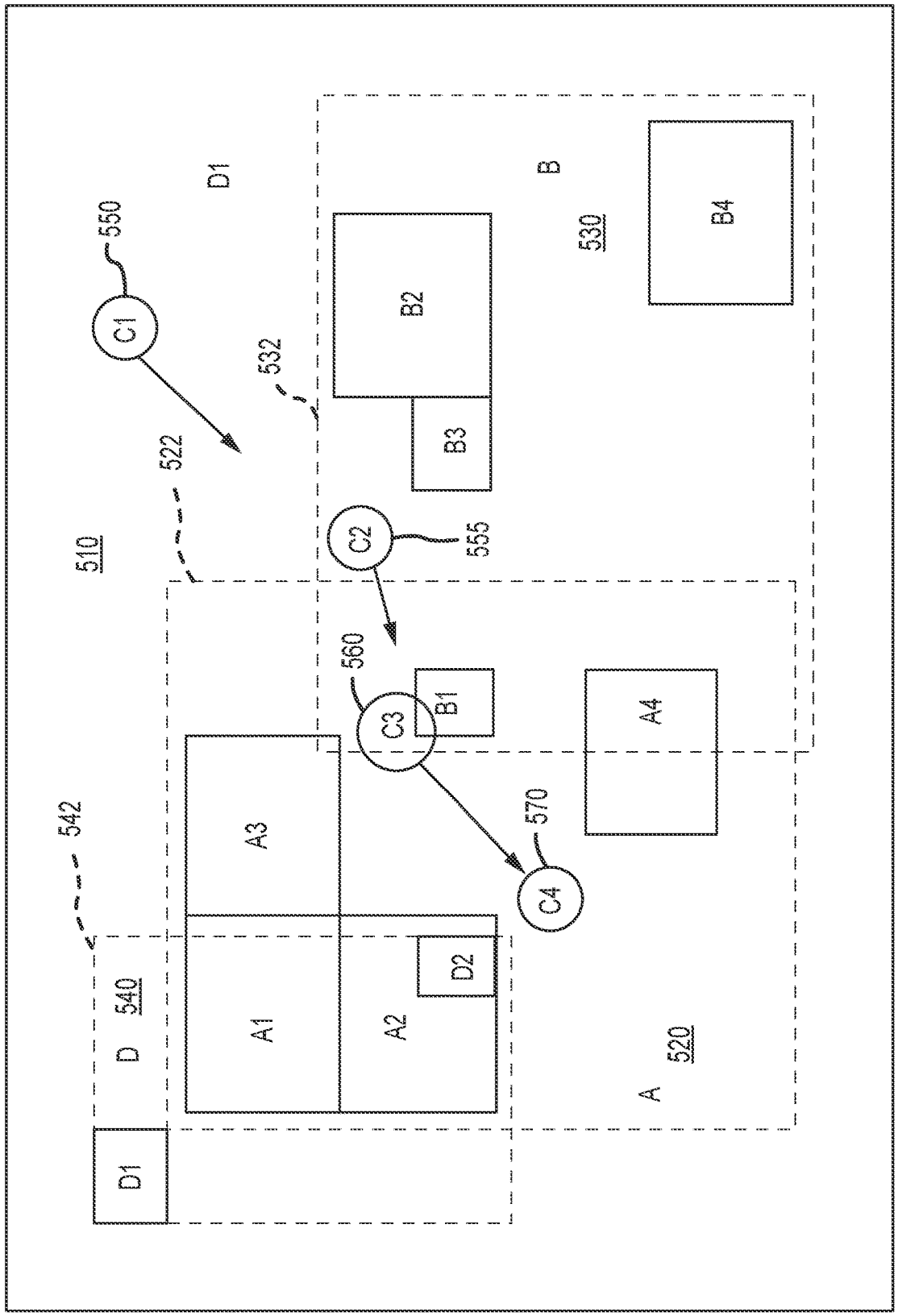
FIG. 5 illustrates path data processing from a vector-based data source possessing three objects, each with their respective bounding box according to one embodiment of the present invention.

To fully understand the process by which the present invention collects object path data on a real time basis consider the three bounding boxes of FIG. 5. FIG. 5 presents path data processing from a vector-based data source 510 possessing three objects, each with their respective bounding box 520, 522, 524 according to one embodiment of the present invention. Object A 520 includes elements (a collection of points and line segments) A1, A2, A3 and A4. Dashed line A represents the bounding box 522 encompassing object A 520. Object B 530 includes elements B1, B2, B3 and B4. Dashed line B represents the bounding box 532 encompassing object B 530. Object D 540 includes elements D1 and D2. Dashed line D represents the bounding box 540 encompassing object D 540. As shown the bounding boxes and the elements of each object can overlap.

As the cursor and its sense area is moved across the document, the present invention identifies the encompassing bounding boxes. Initially, at position C1 550, the cursor lies on the document 510 but outside of any bounding box. No information is collected. As the cursor moves from the upper right corner toward the lower left corner of the document, position C2 555, it encounters and is encompassed by the bounding box 532 of object B 530. Once encompassed the present invention queries the data library for path data regarding each element in object B 530. In this case element B1, B2, B3 and B4. As the cursor travels to position C3 560 it becomes additionally encompassed by the bounding box of object A 520. Path data for elements A1, A2, A3 and A4 are added to the collected path data library. As the user moves the cursor to position C4 570 it exits the bounding box 532 of object B 530 while remaining within object A's bounding box 522. The present invention, in one embodiment, retains the information collected from object B 530. Consequently, should the user move the cursor back to the right the invention would recognize it possesses the object path data of object B 530 increasing the processors capability to focus on other tasks. Note that the cursor does not, in this illustration, cross within the bounding box 542 of object D 540. Path data with respect to elements D1 and D2 are not collected nor stored even though element D2 resides within the bounding box 522 of object B 520. Should the cursor move up and to the left thereby being encompassed by the bounding box represented by dashed line D, the path data will be retrieved.

One of reasonable skill in the relevant art will recognize that the association of bounding boxes and objects are happenstance. Indeed the present invention interaction with bounding boxes and objects is solely to gain path data of said objects. The present invention accept a variety of vector file (path data) formats so as to form a point-map-to-line-segment array. The present invention manages, decodes, and correlates path data to enable predictive processing.

Path data a collection of point data. A vector drawable is a drawing syntax (set of commands). Said differently, a vector drawable is a representation of a vector using a series of common commands. Path data can be represented as vector drawable (SVG, PDF, etc.). Unlike image formats such as JPEG, PNG, GIF and the like, vectors do not lose quality as they are scaled. Basic vector drawable commands are comprised of an alphabetic symbol followed by one or more numbers (X,Y). For example, a moveto command, (moving the cursor), can be represented by the letter M followed by two coordinates (X,Y). M100,100 would move the cursor to absolute coordinate X=100, Y=100. Similarly in command L, representing a lineto command followed by two coordinates (X, Y), draws a line from the current position to the position specified by the X,Y coordinate. Continuing with our prior example, L300,100 draws a line to coordinate X=300, Y=100 starting at X=100, Y=100. Path data commands can include moveto, lineto, bezierto, configure and the like. (Bezierto draws an open smooth curve, determined by a first point, a last point, and two control points called a frame).

While path data establishes the points, lines, arcs and generally the image rendered on the vector based document, it, by itself, is not entirely helpful in the estimation process. The path data must be organized and decoded.

Figure 6:
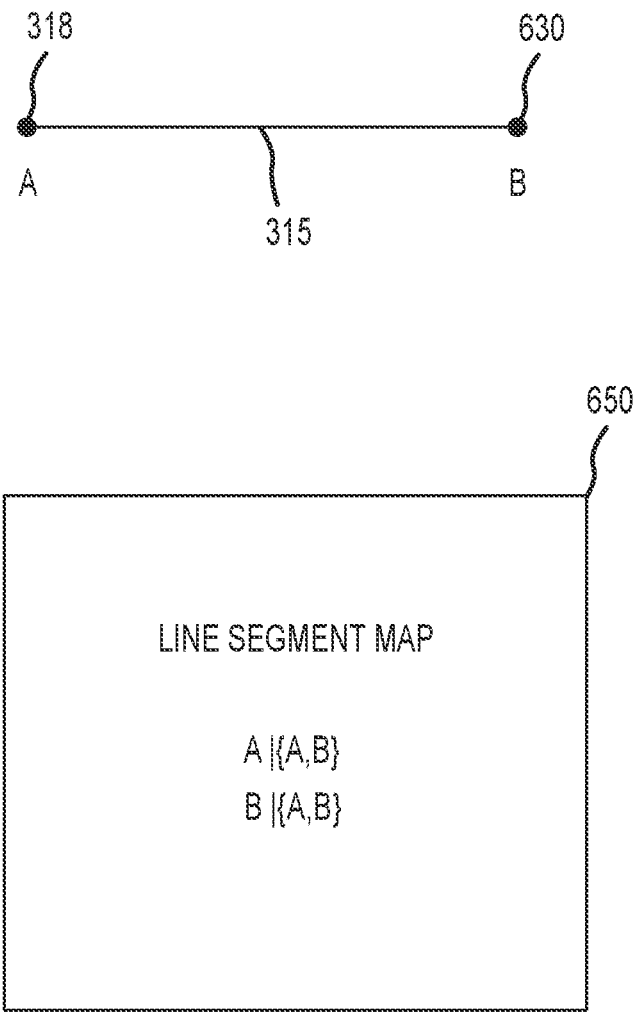
FIG. 6 is a simple drawing of a line segment (A, B) and its associated point-map-to-line-segment array, according to one embodiment of the present invention.

According to one embodiment of the present invention path data from sensed objects are collected, decoded and formed in to a point-map-to-line-segment array. The array represents a map providing a key to value pairs. The keys are end points of line segments. Each key's value is an array of line segments that are connected to the key's point. FIGS. 6 and 7 illustrate path data, points, line segments and the creation of the point-map-to-line-segment array of the present invention. FIG. 6 is a simple drawing of a line segment (A, B) 315 and an associated data table. There is one line segment, AB, that has two end points A 318 and B 630. Therefore the map 650 has a key for point A 318 with respect to line segment A to B 315 and a key for point B 630 with respect to line segment A to B 315. For example, the line segment points (i.e., A and B) have the x, y (i.e., {{100, 100},{300,100}}) of the line segment A to B. The point-map-to-line-segment array of the present invention decodes this data and captures both instances. As shown the array includes line segment AB having endpoint A and endpoint B.

FIG. 7 provides a more illustrative and real world example of the point-map-to-line-segment array of the present invention. FIG. 7 presents five line segments and their representation in a point-map-to-line-segment array according to one embodiment of the present invention. With additional reference to FIGS. 3 and 4, the line segments represented in FIG. 7 are found in the upper left corner of the object(s) sensed and collected. As previously discussed, as the cursor was encompassed by an object's bounding box the present invention collected element path data from the vector-based drawings data library. This path data, from two separate objects, results in the five line segments shown in FIG. 7.

As discussed in FIG. 6, each line segment includes two endpoints and two unique representations. The point array correlates the path data and line segment representation point by point. Rather than simply listing each line segment, the point-map-to-line-segment array, identifies all sensed line segments originating from a single point. For example, point A 318 is associated with a line segment A to B, B to A 315, A to F and F to A 410. But from point A's perspective, and as organized in the point-map-to-line-segment array, point A 318 is associated with line segment A to B 315 and A to F 410. Similarly, point F 710 is listed in the array as associated with line segment F to A 410 and F to G 440. The present invention also recognizes that a line segment is collection or locus of points. The point-map-to-line-segment array includes an understanding of those points enabling, in one embodiment, the cursor location to recognize when it is in proximity of a "point-on-line" or, said differently, within the proximity of a point comprising the line segment apart from the endpoints.

Recall that many vector-based data documents are an amalgamation of points, line segments, arcs, and the like. The are often created by a team of individuals and indeed may be formed by separate entities only to be combined to form the final document. Points and lines may be overwritten or closely aligned inconsistently. Indeed, what appears to be a single point at which two lines join may be separate line segments that are indeed unique. One feature of the present invention is to organize and correlate vector path data. Using the point-by-point organization of the point-map-to-line-segment array the invention enables the use to tolerate minor deviations that exist in path data. For example, assume a vector-based data document includes two lines that appear on a user interface to share a common point. Yet the collected path data identifies the endpoints are actually distinct. Assume one line segment ends at point 100, 100 while the other line segment ends at 100, 101. In this instance the difference is insignificant and clearly indicated that the draftsperson intended the points to coexist. One embodiment of the present invention enables the user to set a collection/correlation tolerance. For example the user can set a ±2 unit tolerance, by which points falling within that tolerance will be treated as coexisting. In doing so, the point-map-to-line-segment array reduces inconsistencies found in many vector-based documents. As a result, the point-map-to-line-segment array's structure enables one embodiment of the present invention to predict a subsequent point/line as a user captures data for estimative purposes.

For example, if the user sensed and committed to a point on line segment AF 410, shown in FIG. 7 (assuming line snap mode is selected), the present invention would present to the user in one embodiment, likely segments F to A 410 and F to G 440 as the next logical point for consideration depending on the current cursor location 720. In each case a point is first sensed on a nearby line segment. A 'sensed point' 725 (in point mode for example) would be on the A to F line segment 410, (not necessarily on an end point— using standard vector mathematical calculation for point on a (clamped) line segment). A 'best line segment' would be saved, in this case as A to F. Upon the user committing to a point in point snap mode, there would only be one point accepted, which would be connected (dashed line) to the next 'sensed point'. When the second point is committed, a solid line segment is formed between the two committed points.

In line snap mode 'sensed line segment' would be the end points of the line segment A to F 410, with F 710 as the exit point. Upon the user committing to the sensed line segment, the invention predicts the ordering of the line segment as A to F with the exit point being point F. If the sense indicator 730 was closer to point A 318 than F 710, the invention would order the line segment F to A and identify the exit point as point A 318.

Assume for the purpose of this discussion the user moved the cursor 720 toward point A 318. The present invention would access the point-map-to-line-segment array 770 and (upon user commitment) snap the cursor to point A 318 (in line snap mode). Moreover, the motion and relationship of line segment F to A and A to B would enable the present invention to highlight segment A to B and B to C as the likely path for consideration. If, for example the point-map-to-line-segment array had identified that at point B, two or more possible paths are possible, (point X for example), at that point the invention would pause selecting further line segments as possible paths for consideration until the user advanced additional points to the committed points array.

Figure 8:
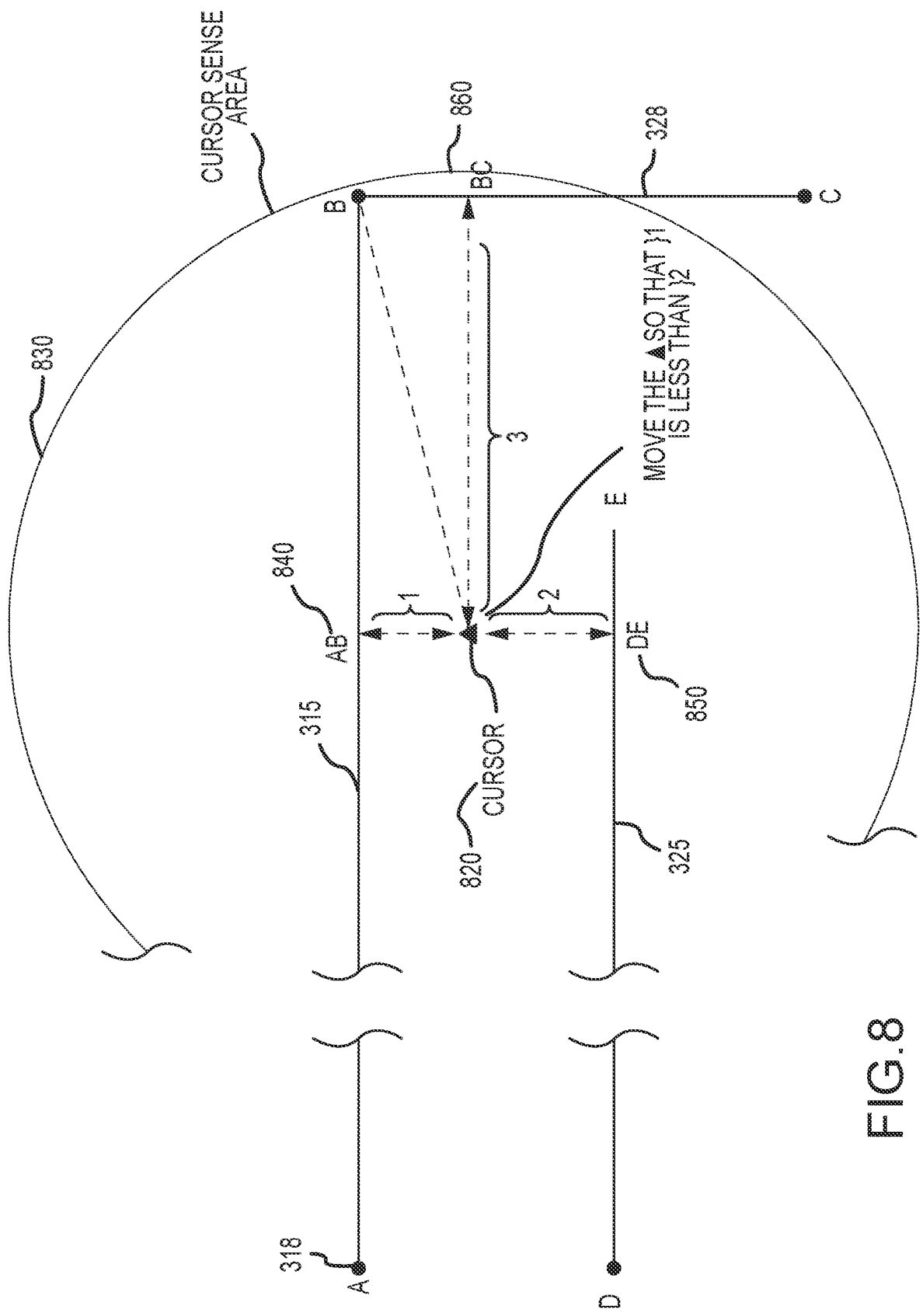
FIG. 8 shows interaction between the location of the cursor, sense area surrounding the cursor and the point-map-to-line-segment array in identifying the next logical/predicated snap point, in accordance with one embodiment of the present invention.

FIG. 8 shows interaction between the location of the cursor, sense area surrounding the cursor and the point-map-to-line-segment array in identifying the next logical/predicated snap point. Illustrated in FIG. 8 are line segments A to B 315, B to C 328, and D to E 325. The cursor 820, presented as a triangle, is surrounded by a cursor sense area 830. The size of the sense area 830 is user selectable and is, in one embodiment, visually fixed in size. As the rendering size of the sense area is fixed, the sense area/object interaction varies based on the degree of vector-based document magnification. In one embodiment the size of the sense area is set at a radius of 25 units while in another it is 50 units. When the vector-based document is at 100% magnification the unit measurement for the sense area and the document are at a 1:1 ratio. However as a user zooms in on a particular zone, the sense area surrounding the cursor optically remains the same, while the relationship to the document changes. For example of the user zooms to a 200% document rendering, the sense area ratio is 1:2. Indeed the size of the sense area may, in another embodiment, be user selectable.

In FIG. 8 the cursor 820 is positioned by the user between line segments A to B 315 and D to E 325. While the entirety of each line segment is not within the sense area 830, mathematically, points on the line segments can be discerned (calculated). The present invention continually measures the distance, within the sense area 830, between each point forming each line segment and the cursor location. In this example, a portion of each line segment, A to B 315, D to E 325 and B to C 328 lies within the sense area 830. The distance from the cursor location to the closest point-on-line of segment A to B 315, AB 840, is shown as distance 1. Likewise, the distance from the cursor location to the closest point-on-line of segment D to E 325, DE 850, is distance 2 and the distance from the cursor to point-on-line of segment B to C, 328 BC 860, is distance 3. In this case distance 2 is greater than distance 1 and distance 3 is greater than distance 2. Accordingly, a calculated point, AB 840, on the line segment A to B 315 is the closest point to the cursor.

The distances between the cursor location and any point of any line segment within the sense area is continuously calculated and compared. Depending on the mode selected by the user, the cursor snaps to the closest point-on-line or other point associated with the line segment when the user commits. For example, in point snap mode, the cursor snaps to the closest point-on-line, highlights the point, stores the 'best line segment' on which the point-on-line is associated for later use and identifies the endpoints of the line segment. In this example the cursor will snap to point AB on line segment. Moreover, the point-on-line on which the cursor now resides is stored in a committed point array. As the user continues to move the cursor and commit to additional points, the user can determine metrics such as distance between committed points, an enclosed area, and the like. To clarify, the 'sense indicator' remains around the cursor, until a snap occurs (user commitment). At that point in time the 'sense indicator' moves to the nearest calculated point (point mode), the exit point (end point nearest the cursor (line and polyline mode).

In line snap mode, as the cursor determines the closest point-on-line of a nearby line segment and predicts the direction of the line segment forming an ordered line segment. Recall the line segment with endpoints A and B can be represented by a line segment A to B and/or a line segment B to A. The present invention predicts the direction of the line segment, in one embodiment, by the position of the point-on-line on the line segment and/or the position of the cursor. For example, assume that for the line segment defined by endpoints A and B, the best point-on-line is based on cursor location with respect to endpoint B and endpoint A. As the cursor and point-on-line is closer to endpoint B the line is thereafter ordered and stored as A to B rather than B to A wherein A is the entry (start) point and B is the exit point. Upon the user committing to the line segment, the line segment is highlighted (accepted) and the cursor jumps to the exit endpoint. In this example the cursor would snap to endpoint B and the entirety of the line segment would be highlighted (selected). The ordered line segment, A to B, is further stored in a committed line segment array.

In other embodiment the ordering of the line segment may consider movement of the cursor in relation to any detected point-on-line. For example, assume the detected point-on-line of line segment A to B is closer to point A than point B. However, the user may move the cursor toward the direction of point B implying a preferred ordering of the line segment. In this embodiment, the invention would recognize the movement as the user's preference and order the line as starting at point A and exiting at point B. Other methodology to order each line segment are also possible and are indeed contemplated.

The present invention also recognizes the movement of the cursor and predicts additional committed line segments using the point-map-to-line-segment array. Turning back to the prior example, assume that endpoint B is also associated with line segment B to C. As discussed, the line segment associated with points B and C can be represented by B to C and/or C to B. Even though the cursor may be closer to endpoint B than endpoint C, the committed order nature of line segment A to B predicts that the line segment with endpoints B and C will be ordered B to C. With that prediction the invention, according to one embodiment, highlights line segment B to C and snap the cursor to endpoint C based on user movement. Once committed by the user, line segment B to C is added to the committed line segment array linking line segment A to B and B to C.

To better illustrate line snap mode in operation consider the following example. Assume a user wants to determine the linear length (circumference) of the interior dimensions of a room based on vector-based data. Assume all of the objects and their respective path data have been sensed and recorded in the point-map-to-line-segment array. As a user moves the cursor within sense range of one line segment, a point-on-line of the line segment will be sensed, the line segment ordered and the cursor will, in this embodiment, snap to the exit endpoint. At that point the user will commit (accept) to the line segment. In one embodiment the user can interact with the invention by right clicking on a mouse, using a verbal command or any others means by which a user can interface with a computer program and indicated that the line segment is to be stored and retained (committed). As the user moves the cursor toward another corner of the room a dashed line will tie the cursor to the exit point of the committed line segment as additional line segments are sensed. Upon sensing a new line segment and assuming it shares in common the prior endpoint, the invention orders the new line segment with the common prior endpoint being the new line segments starting point. The cursor thereafter snaps to the next logical endpoint. The user again commits to the line segment adding it to the committed line segment array linking the line segments. In a similar manner the user can quickly identify and commit to each line segment comprising an outline of the room. Moreover, the user can be assured that endpoints of each line segment are accurately captured making the estimation of linear length accurate. This line-segment-by-line-segment approach enables the user to quickly, yet accurately move throughout a document to identify specific needs during the estimation process.

Polyline mode is yet another feature of the present invention that aids in efficient an accurate data collection. A polyline is a list of points, where line segments are drawn between consecutive points as a single object. A polyline can include straight line segments, arcs or any combination of the two. A polyline is the combination of all lines that are connected without 'forks'. (Note: arcs (Beziers) are converted (smoothed) into multiple line segments in the vector drawing decode phase). In polyline mode the present invention capitalizes on the ability to predict and snap to the next line segment such as in line snap mode by identifying all of prior consecutive points connected to one or more starting. Rather than stopping at the line segment entry point as describe above in line snap mode, polyline mode continues backwards until a junction is reached having multiple paths.

Recall the order of objects in vector-based documents and generally vector-based data can be happenstance. Accordingly, what appears to be a fluid continuous connection of line segments and/or arcs can be a plurality of disjoint objects. Yet from a construction estimation process the entirety of the shape must be quickly and accurately assessed. In one embodiment of the present invention, a continuous path between consecutive points is predicted using data from the point-map-to-line-segment array. As in the line snap mode, when the cursor senses and identifies a point-on-line, the line segment is highlighted and the cursor snaps to the endpoint of the now ordered line segment. In a polyline a series of prior sequential line segments and/or arcs are thereafter highlighted and with a single user input the entirety of the polyline can be committed and stored. The predictive nature of the invention stops when a polyline reaches a point at which there are multiple paths. At that point the user must commit to the prior series of line segments and then indicate on which path to proceed. In large complex drawings comprising multiple objects having shared endpoints, the invention can quickly capture a sequence of consecutively linked objects.

With attention again to FIG. 7, the process by which polylines are predicted can be illustrated. Assume, for this embodiment, that the cursor senses the line segment F to A 410. The position of the cursor, as it is closer to point A 318, directs that line segment will be ordered F to A 410 meaning that point F 710 is the entry (start) point and point A 318 is the exit point. In one embodiment of the present invention the point-map-to-line-segment array is accessed to determine if the entry point, point F, is shared by other line segments. In this example point F is common to line segment F to A 410 and F to G 440. In this embodiment and in polyline mode the present invention would modify the entry point of line segment F to A 410 from point F 710 to point G 780. As a result the line segment combination G 780 to F 710 to A 318 is highlighted and can thereafter accepted by the user. From that point the user can move forward and add additional line segments to the polyline. Note that if point F 710 was associated with more than one additional point (e.g. additional line segments) the invention would maintain point F 710 as the entry point.

The predictive tool of the present invention snaps the cursor to the next logical element such as a point, line, or set of logical connected lines. The user can switch modes to identify the type of element the cursor will snap to aiding in accuracy and efficiency. The invention further detects, in other embodiments, intersections and juncture points of lines, both visible and invisible, and provides the user with the means to either access these intersections or ignore them. For example, registration lines, present on most vector-based architectural drawings, present intersections that, for the purpose of takeoff estimations, should be ignored. The present invention is selectable to ignore or recognized such elements as required.

Each blueprint/vector-based document includes multiple facets and will typically describe substantially all of the elements need for construction. This means there will be doors, support posts, conduit, fixtures, etc. Only a small portion of these points and lines are relevant to a particular type of estimation. The present invention does not require a specially create PDF, vector-based document, nor simplified blueprints. The system processes (or not) intersections and junctions in real-time as selected by the user.

In practice the present invention sense proximity of the cursor to a select type of vector element. When a user has selected point snap mode as the element of choice, the cursor provides a sensing area rendition, shown as a dashed circle, under which it is looking for point on nearby line segments, referred to herein as point-on-line. As explained above, a line typically has two endpoints. As the cursor comes within proximity of a point the dashed circle becomes dotted, indicating that within the circle a point-on-line has been identified. Note, using endpoints of a line segment, vector mathematics determines the locus of infinite points on the line.

The present invention senses all vector-based objects and collects their path data within the designated (illustrated) sensing area. By providing indicators, prediction on direction and point/endpoint/line modes, with modifiers, the present invention covers the needs of all the different types of users. By adding predictive intelligence the present invention selects the most logical solution for the user. This selection is based on the type of points/lines and their proximity with respect to their points/lines as well as the movement of the cursor by the user. With the ability to snap to a point or line segment, the user is merely required to find the logical path for themselves, greatly reducing the time-benefit.

In another embodiment of the present invention, the system searches/matches non object-based vectors as 'objects' (i.e. smoke detector, door, etc.) from a selected area in the drawing. Once an object, such as a smoke detector is identified, the system thereafter looks for this same configuration of points and lines. This would enable automated "counting" of objects, which is an extremely time-consuming task since the user must, using technology of the prior art, identify visually each the objects on the vector-based document.

One or more embodiments of the present invention splits functionality of the identification of vector-based objects between identifiable elements: points, endpoints, lines, intersections, junctions, polylines, etc. Using the movements of the cursor by the user and the user's ability to selectively choose which type of element they are seeking; the present invention repositions the cursor to the object of choice. Modifiers can also be employed to enable processing options, such as: line jump, processing intersections/junctions, capturing area, distance, and the like. This makes the user interface of the invention better, quicker and more efficient to use.

The predictive nature of the present invention enables the user to see a visualized logical measurement path through the drawing and, if correct, immediately accept it with one click. That projected or committed path as discussed herein saves the user a significant amount of time since they do not have to detail each segment and point along the way. The various extraneous elements (noise) of the vector-based data (extra points, hash marks, etc.) make automated path selection techniques of the prior art impractical since there are so many "interruptions".

Figure 9:
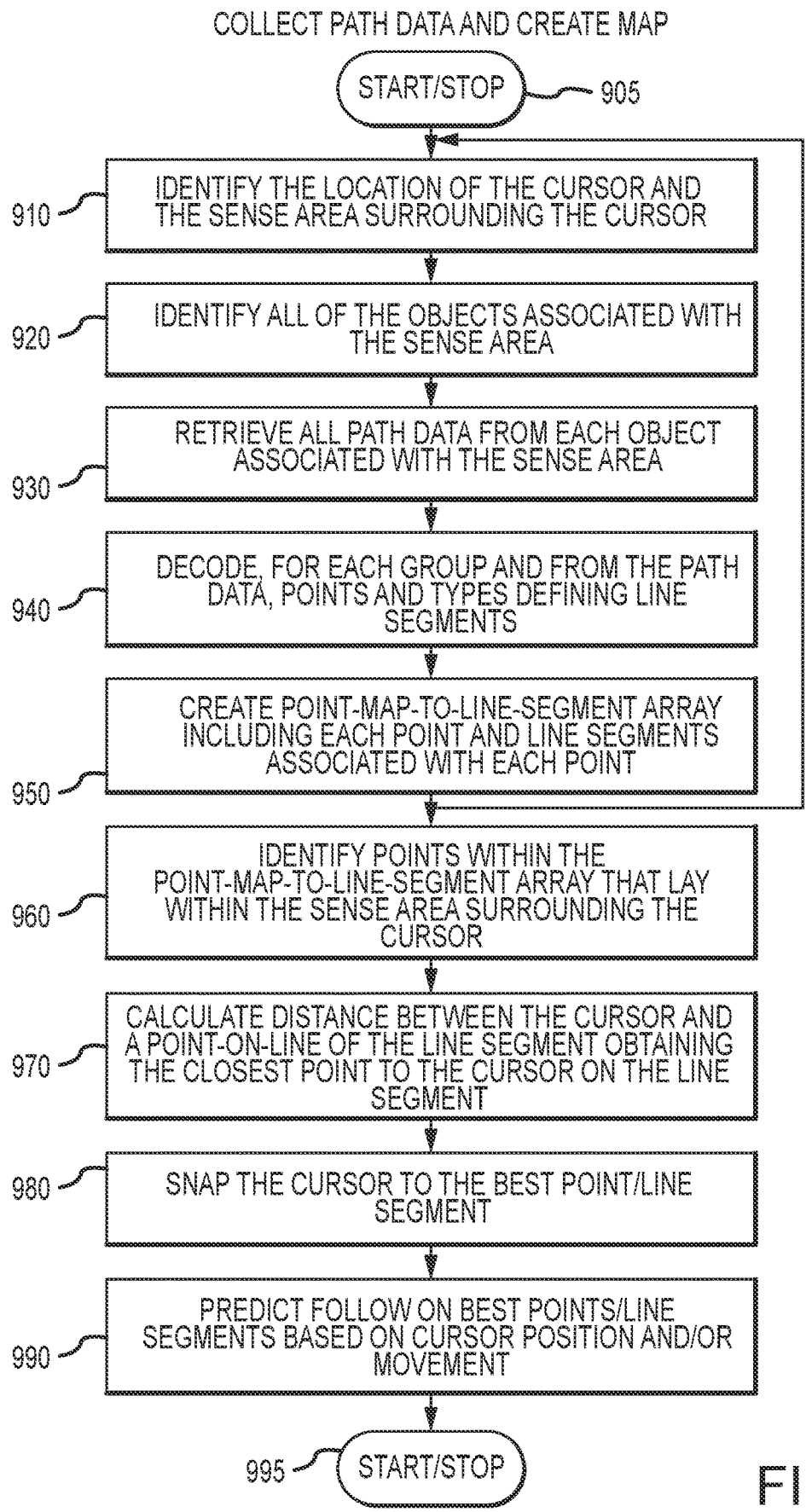
FIG. 9 is a flow chart for one methodology embodiment for the collection and organization of vector path data of the present invention.
Figure 10:
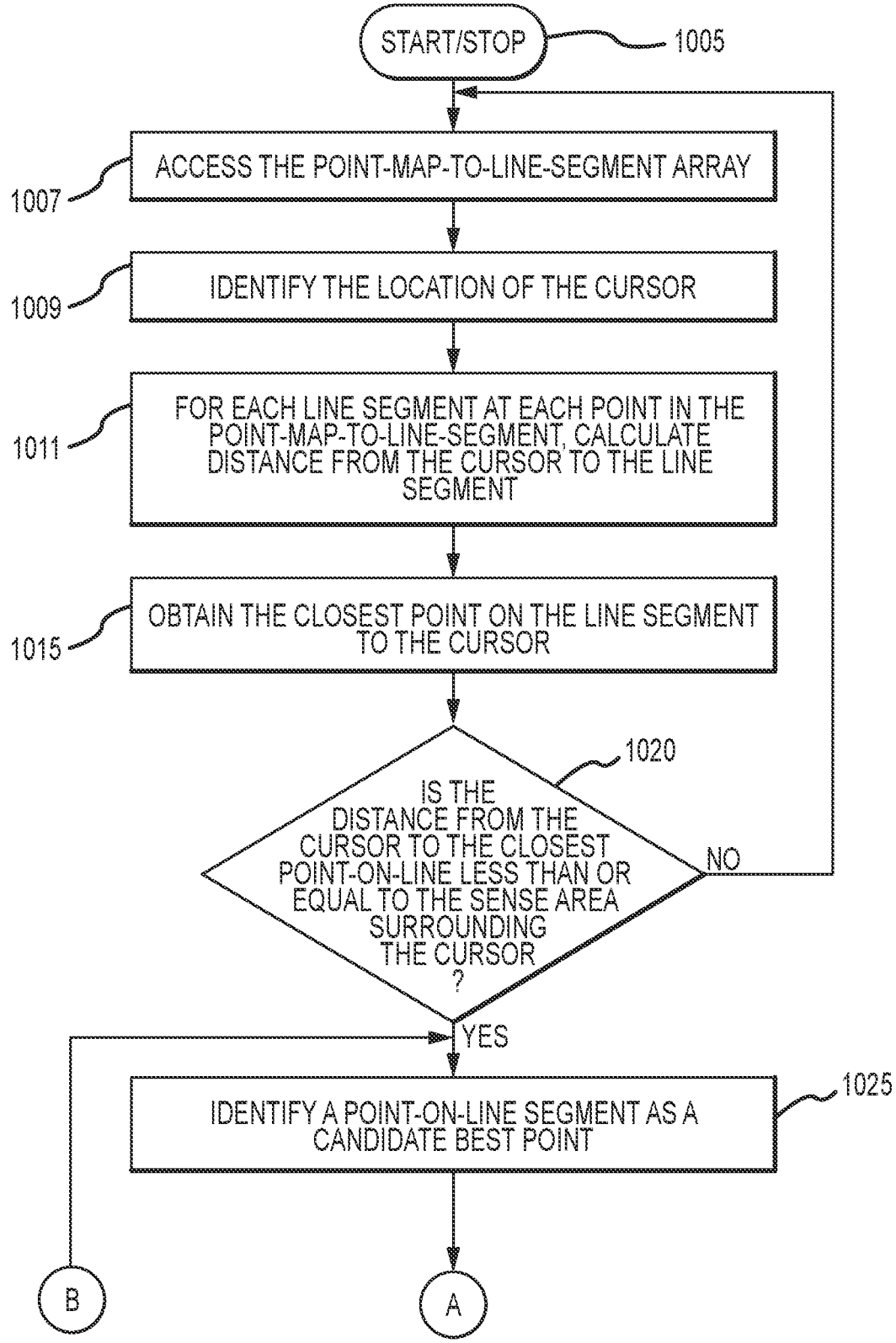
FIG. 10 provides a detailed flowchart of one methodology for vector-based data prediction of construction cost estimation according to the present invention.
Figure 10A:
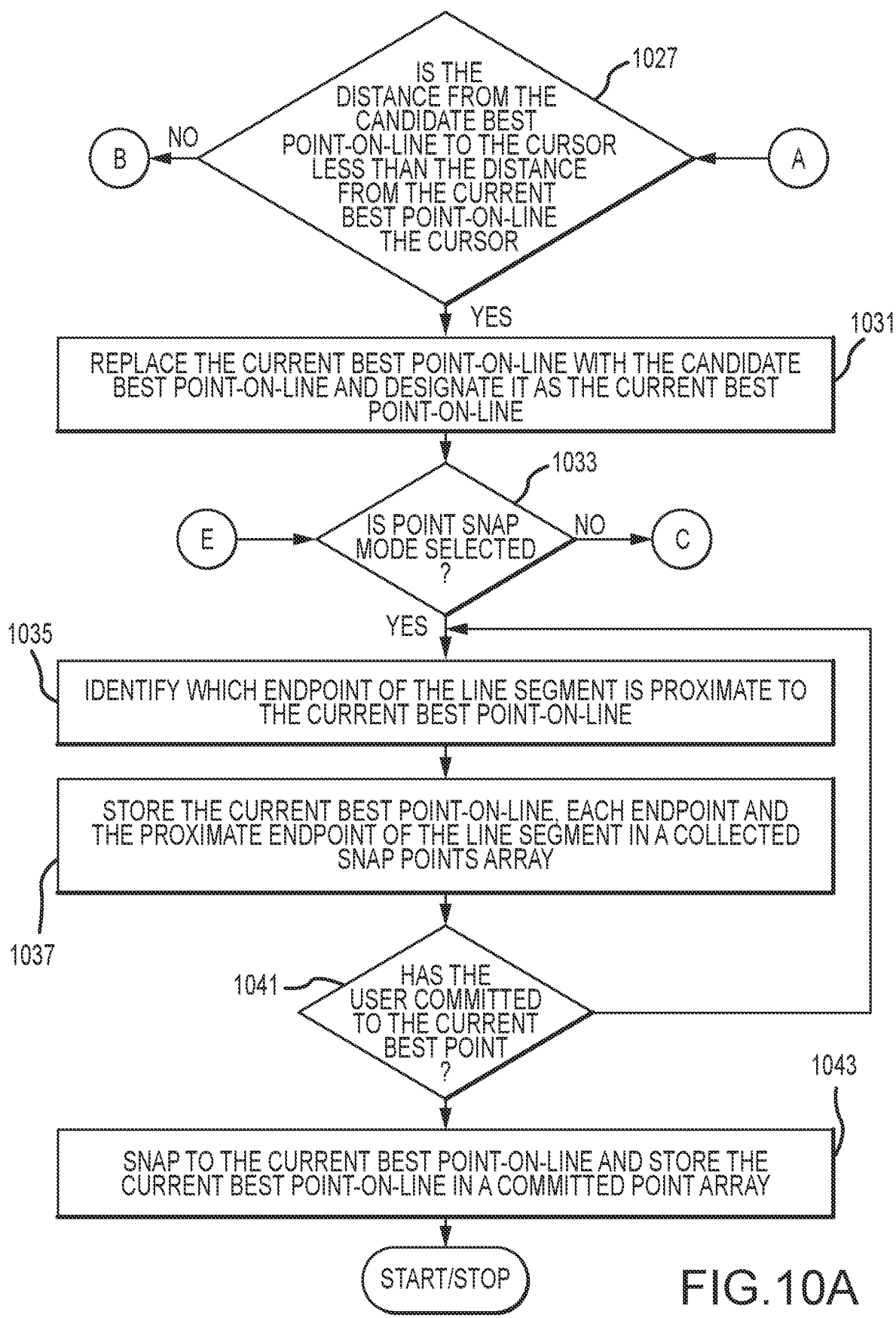
Figure 10B:
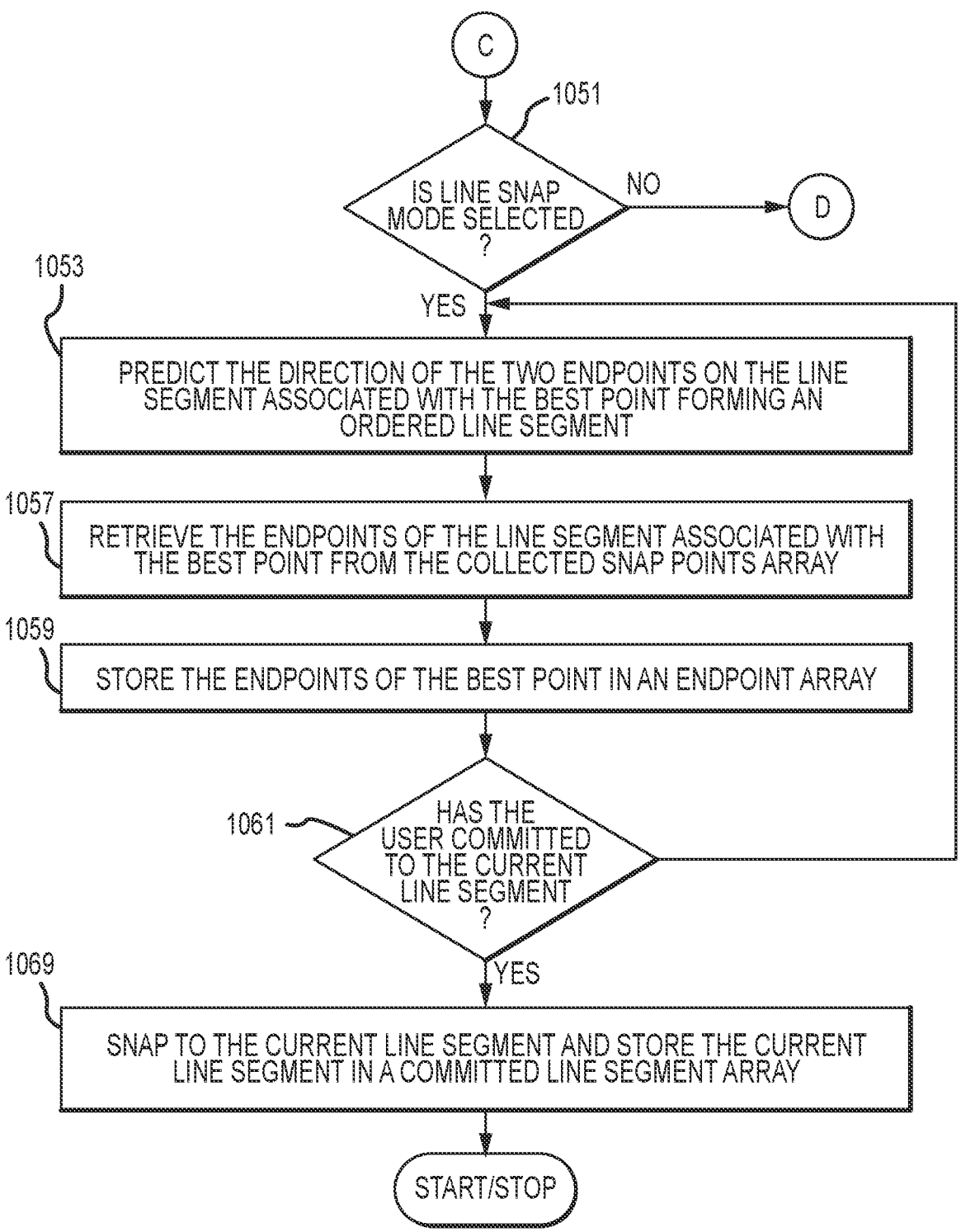
Figure 10C:
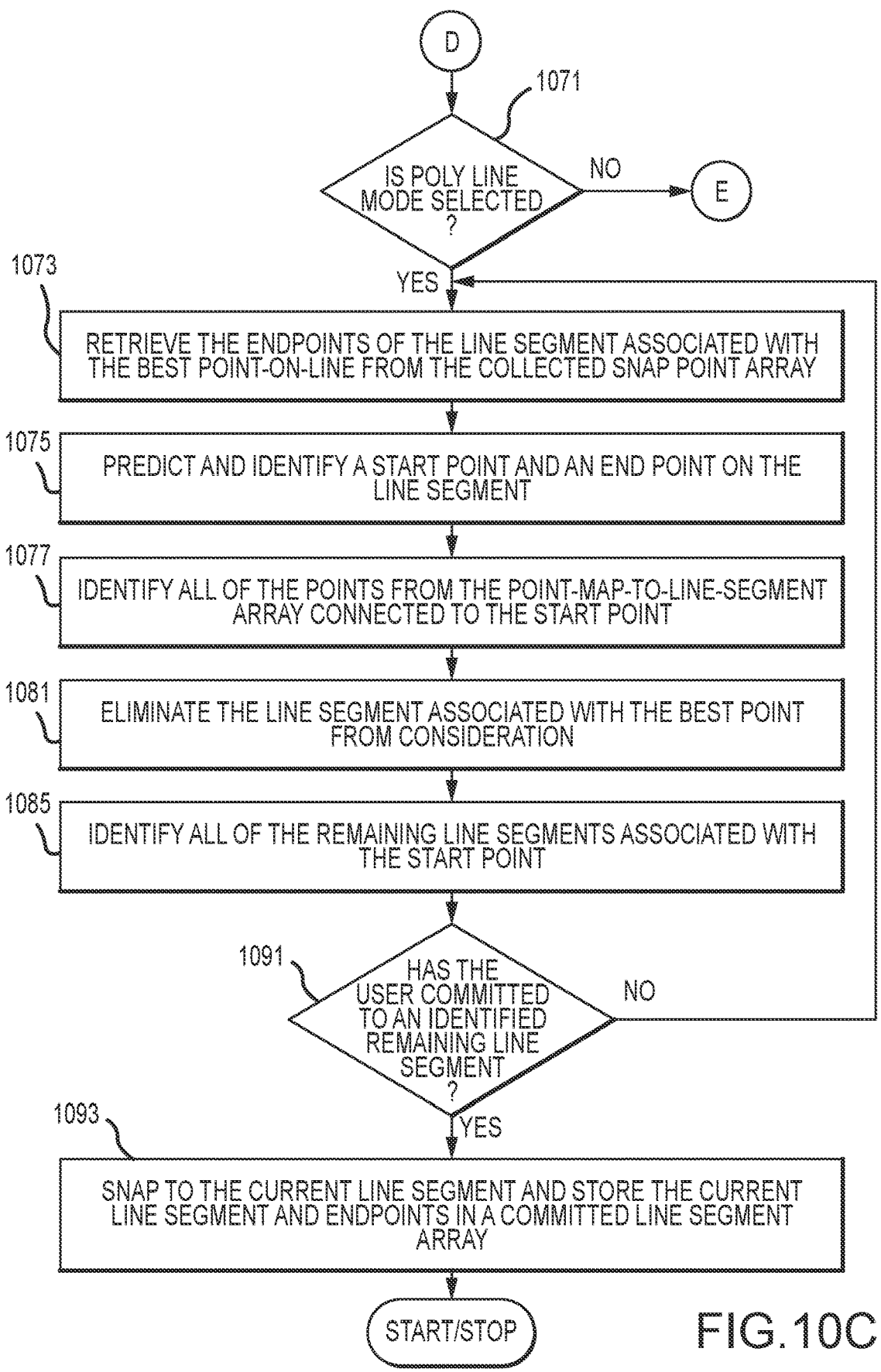

The processes by which vector-based data can provide a predictive guide for construction cost estimation are illustrated in FIGS. 9 and 10. FIG. 9 is a flow chart for a methodology for the collection and organization of vector path data. The process begins 905 with identifying 910 the location of a cursor, and the sense area surrounding the cursor, in relation to vector-based data.

Using the cursor as a point of reference, an object collection module identifies 920 each object (or groups of objects) and interacts with a data library, data store or the like, to retrieve 930 path data associated with identified objects. The collected path data is decoded 940 to identify points, line segments and the like. The decoded information is thereafter correlated and assembled 950 into a point-map-to-line-segment array. The point-map-to-line-segment array, also referred to herein as a map, identifies, for each identified point, associated line segments. As can be appreciated by one of reasonable skill in the relevant art, a single point may be associated with several different line segments. And while an object's path data may define a line segment starting at one point and ending at another, the present invention recognizes that a line is merely the collection of points that lie along a defined direction having a beginning and end point. The organization of the array, moreover, enables the invention to quickly ascertain possible paths by which a user may travel from a selected/identified point on a document.

With the point-map-to-line-segment array defined and stored, the present invention once again accesses the position of the cursor and surrounding sense area to identify 960 points within the point-map-to-line-segment array that lie within the sense area. A point-on-line is identified by calculating 970 the closest point, of the collection of points making up the line segment, to the cursor. In point snap mode, once a point-on-line is identified and accepted, the cursor will snap 980 to that point. Using this point-on-line as a starting point the invention thereafter predicts 990 follow-on best points, line segments and polylines using the position and/or movement of the cursor, ending 995 the process.

FIG. 10 provides a detailed flowchart of one methodology for vector-based data prediction. The process begins 1005 with accessing 1007 the point-map-to-line-segment array in view of the location 1009 of the cursor on a user interface. One of reasonable skill in the relevant art will recognize that vector-based data can be rendered on a computer screen, monitor or the like in several formats. Each rendered object includes path data telling the rendering device how to depict the object with respect to the desired format. For example, a word processing document on a computer screen illustrates lines of letters and words to form sentences. As a user types on a keyboard, the computer is receiving user inputs (commands) to generate an object at a certain position on the screen. That position is also registered with respect to the document format so that upon it being saved and reopened or printed, the same rendering can be presented. In a word processing document, every letter may be an individual object. In a graphic document, the objects may be points, line segments or the like. Path data provides information on how that object (e.g. a line segment) is to be interpreted and is stored in the point-map-to-line-segment array of the present invention.

As the cursor is moved by the user the distance between the cursor's location and the points in the point-map-to-line-segment array are continually calculated 1011 and compared. Knowing the size of the sense area surrounding the cursor, when 1020 the distance between the cursor's location and a point in the point-map-to-line-segment array is less that the radius (size) of the sense area, the invention identifies to the user that the cursor has identified a point-on-line within the designated sense area. In one embodiment line representing the edge of the sense area changes to provide the user feedback that a point has been sensed. The closest 1015 sensed point to the cursor is identified 1025 as point-on-line of the sensed line segment end is labeled as a candidate best point.

It is entirely possible, indeed likely, that more than one line segment may fall within the sense area at any point of time. Accordingly, the present invention identifies the closest point-on-line of each line segment within the sense area and compares the distance from the cursor to each. One point-on-line is initially set as the current best point-on-line. When 1027 the distance to a candidate best point-on-line is less than the current best point-on-line, the current best point-on-line is replaced 1031.

The present invention may operate in several distinct modes of operation. In one embodiment, the present invention enables the user to select between point snap mode, line snap mode, and polyline mode. While these three modes are illustrative of the flexibility of the present invention, the reader will recognize that other modes using the concepts and methodologies presented herein are possible and are indeed contemplated. When the user selects point snap mode 1033, the invention identifies 1035, in this embodiment, which endpoint of the current best point-on-line line segment is proximate (closest) to the current best point-on-line. The current best point-on-line, each endpoint from the point-map-to-line-segment array, and the proximate endpoint are stored 1037 in a collected snap point array as the cursor snaps to the current best point-on-line.

At this point the invention inquires whether the user has committed 1041 to the currently sensed and identified best point-on-line. The user can commit (accept) through various modes of user interface such as a click on the mouse, voice commands, keyboard entries or the like. Upon receiving a commit command (mouse right click) the current best point-on-line is stored in a committed point array and the cursor snaps 1043 to that location. This newly stored point becomes a start point from which the user can connect other points, line segments and the like. As the user moves the cursor away from that committed point-on-line, an application generated line ties the cursor to the committed point. (also referred to as a rubber banding). The user can thereafter move the cursor to sense another point-on-line, commit to that new point and connect the two, now committed points.

The user may also select 1051 line snap mode to aid in the construction estimation process. Regardless of the selected mode of operation, the present invention continually senses and identifies a best point-on-line of any sensed line segment. The program then uses that information differently based on the user selected mode of operation. Line snap mode enables the user to quickly identify line segments recognized in the point-map-to-line-segment array and connect them as necessary to gain estimation data. To do so the line segment associated with the sensed point-on-line is ordered. Based on the position of the best point-on-line with respect to a sensed line segment, the present invention predicts 1053 a line's direction and orders the endpoints, designating one endpoint as a start (extra) endpoint and the other endpoint as an exit endpoint. The invention predicts the user intent to form a collection of line segments during the estimation process. For example, when a user senses a vertical line segment, with the cursor closer to the bottom endpoint, the invention, based on user settings, will predict that the bottom end point is the exit endpoint and the upper endpoint is the start endpoint. However, in another embodiment, the invention identifies cursor movement as an indicator of user intent. Once a point-on-line has been identified the invention monitors cursor motion with respect to the two identified endpoints. The direction and/or motion of the cursor is used to identify the exit point of the ordered line segment. Turning back to the prior example in which the point-one-line is closer to the bottom point, if the user moves the cursor toward the top point, the invention reorders the line segment making the bottom endpoint the start (entry) point and the top point the exit point.

With the line segment ordered, the present invention once again turns to the point-map-to-line-segment array and retrieves 1057 data with respect to ordered line segments. The invention stores 1059 the ordered endpoints pending user commitment to the line segment array. When the use commits 1061 to the line segment the present invention snaps 1069 the cursor to the exit point and stores the now committed, ordered line segment in a committed line segment array. As the user moves the cursor from the now committed line segment a line is tied to the exist end point. Lines that share the exit endpoint can be highlighted and added to the committed line segment array as the user moves through the vector-based document during the estimation process.

Polyline snap mode 1071 enables a user to quickly move thought a series of connected line segments and arcs. The point-map-to-line-segment array identifies each line segment associated with each point. This information is used to identify connected, polylines. The polyline process begins again with the retrieval 1073 of endpoints of the line segment associated with the best point-on-line. As discussed above, the invention predicts 1075 a start (entry) endpoint as well as an exit point on the line segment and orders the line segment. In polyline mode, the point-map-to-line-segment array is accessed 1077 and additional points associated with the start endpoint are identified. The line segment associated with the current best point-on-line is eliminated 1081 from consideration leaving any remaining 1088 line segments that are connected to the start endpoint viable as additional elements or polyline. Upon the user committing 1091 to the line segment, the present invention snaps 1093 to the current line segment and works backward from the start point to add any other line segments flowing from that start point. For example, if the best current point-on-line exists on line segment AB wherein point A is the start endpoint and point B is the exist endpoint, the invention will examine the point-map-to-line-segment array to identify any other points (line segments) associated with endpoint A. Ignoring line segment AB, the array shows, in this example, that additional line segment AF exists. The invention will accordingly link line segment AB and AF redesignating point F as the start point. The invention, examining backwards from the new start point looks at line segments associate with point F. If point F is associated with line segment FX it again redesignates X as the start point. The process continues backward until the start point is either associated with more than one additional line segments or if the start point is a termination point.

In polyline mode a user can identify a single line segment in a series of connected objects and quickly capture the entire structure. As the user moves the cursor forward, the user can skip line segments as long as they are ultimately connected back to the start (entry) point. The connectivity for polyline mode enables the user to quick gain estimations of unique shapes and combinations of line segments and arcs that would otherwise be labor intensive and time consuming.

As originally depicted in FIG. 1, one or more embodiments of the present invention collects and decodes path data from a vector-based data source. Often this data source is a vector-based document such a PDF document or the like. The collected and decoded data is used to form a point-map-to-line-segment array. This array, in combination with the user's selection of point snap mode, line segment snap mode or polyline mode, allows the invention to quickly gather information for construction estimation. The location of the cursor and its associated sense area is used to find a best point-on-line which forms the basis of a committed point/line segment/polyline array. From these arrays points, line segments and polylines are linked together enabling the user to capture linear measurements, area information and other numerical data which forms the basis of an estimation.

Those familiar with the art of vector-based manipulations will recognize that the invention described herein may be embodied in other specific forms without departing from the spirit or essential characteristics thereof. Likewise, the particular naming and division of the modules, managers, functions, systems, engines, layers, features, attributes, methodologies, and other aspects are not mandatory or significant, and the mechanisms that implement the invention or its features may have different names, divisions, and/or formats. Furthermore, as will be apparent to one of ordinary skill in the relevant art, the modules, managers, functions, systems, engines, layers, features, attributes, methodologies, and other aspects of the invention can be implemented as software, hardware, firmware, or any combination of the three. Of course, wherever a component of the present invention is implemented as software, the component can be implemented as a script, as a standalone program, as part of a larger program, as a plurality of separate scripts and/or programs, as a statically or dynamically linked library, as a kernel loadable module, as a device driver, and/or in every and any other way known now or in the future to those of skill in the art of computer programming. Additionally, the present invention is in no way limited to implementation in any specific programming language, or for any specific operating system or environment. Accordingly, the disclosure of the present invention is intended to be illustrative, but not limiting, of the scope of the invention, which is set forth in the following claims.

In a preferred embodiment, the present invention can be implemented in software. Software programming code which embodies the present invention is typically accessed by a microprocessor from long-term, persistent storage media of some type, such as a flash drive or hard drive. The software programming code may be embodied on any of a variety of known media for use with a data processing system, such as a diskette, hard drive, CD-ROM, or the like. The code may be distributed on such media, or may be distributed from the memory or storage of one computer system over a network of some type to other computer systems for use by such other systems. Alternatively, the programming code may be embodied in the memory of the device and accessed by a microprocessor using an internal bus. The techniques and methods for embodying software programming code in memory, on physical media, and/or distributing software code via networks are well known and will not be further discussed herein.

Generally, program modules include routines, programs, objects, components, data structures and the like that perform particular tasks or implement particular abstract data types. Moreover, those skilled in the art will appreciate that the invention can be practiced with other computer system configurations, including hand-held devices, multi-processor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located in both local and remote memory storage devices.

Figure 11:
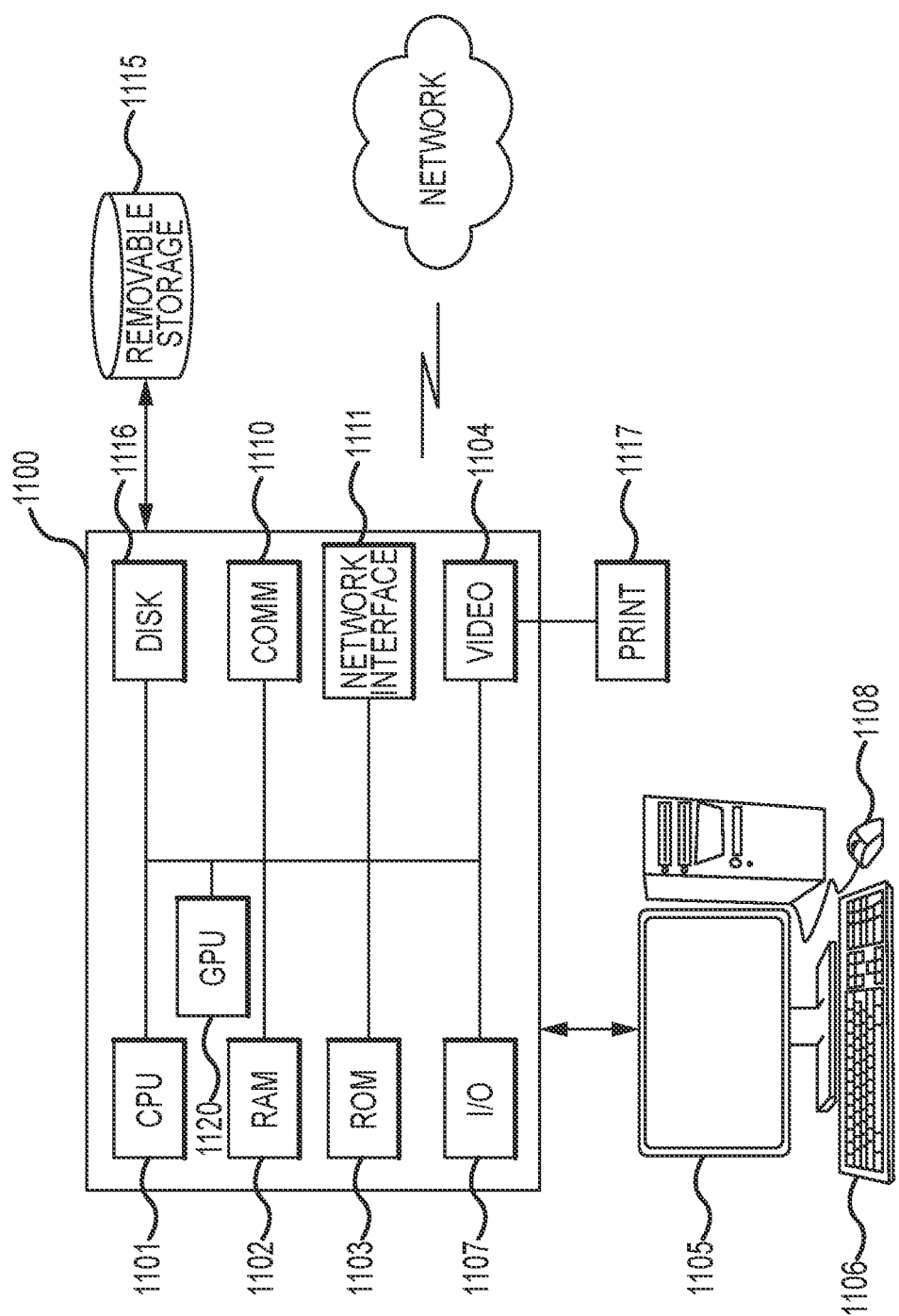
FIG. 11 is a block diagram of a computer system suitable for implementation of one or more embodiments of predictive, vector based construction cost estimation.

One of reasonable skill will also recognize that portions of the present invention may be implemented on a conventional or general-purpose computing system, such as a personal computer (PC), server, a laptop computer, a notebook computer, of the like. FIG. 11 is a very general block diagram of a computer system in which software-implemented processes of the present invention may be embodied. As shown, system 1100 comprises a central processing unit(s) (CPU) or processor(s) 1101 coupled to a random-access memory (RAM) 1102, a graphics processor unit(s) (GPU) 1120, a read-only memory (ROM) 1103, a keyboard or user interface 1106, a display or video adapter 1104 connected to a display device 1105, a removable (mass) storage device 1115 (e.g., floppy disk, CD-ROM, CD-R, CD-RW, DVD, or the like), a fixed (mass) storage device 1116 (e.g., hard disk), a communication (COMM) port(s) or interface(s) 1110, and a network interface card (NIC) or controller 1111 (e.g., Ethernet, WIFI). Although not shown separately, a real time system clock is included with the system 1100, in a conventional manner.

CPU 1101 comprises a suitable processor for implementing the present invention. The CPU 1101 communicates with other components of the system via a bi-directional system bus 1120 (including any necessary input/output (I/O) controller 1107 circuitry and other "glue" logic). The bus, which includes address lines for addressing system memory, provides data transfer between and among the various components. Random-access memory 1102 serves as the working memory for the CPU 1101. The read-only memory (ROM) 1103 contains the basic input/output system code (BIOS)—a set of low-level routines in the ROM that application programs and the operating systems can use to interact with the hardware, including reading characters from the keyboard, outputting characters to printers, and so forth.

Mass storage devices 1115, 1116 provide persistent storage on fixed and removable media, such as magnetic, optical, or magnetic-optical storage systems, flash memory, or any other available mass storage technology. The mass storage may be shared on a network, or it may be a dedicated mass storage. As shown in FIG. 11, fixed storage 1116 stores a body of program and data for directing operation of the computer system, including an operating system, user application programs, driver and other support files, as well as other data files of all sorts. Typically, the fixed storage 1116 serves as the main hard disk for the system.

In basic operation, program logic (including that which implements methodology of the present invention described below) is loaded from the removable storage 1115 or fixed storage 1116 into the main (RAM) memory 1102, for execution by the CPU 1101. During operation of the program logic, the system 1100 accepts user input from a keyboard and pointing device 1106, as well as speech-based input from a voice recognition system (not shown). The user interface 1106 permits selection of application programs, entry of keyboard-based input or data, and selection and manipulation of individual data objects displayed on the screen or display device 1105. Likewise, the pointing device 1108, such as a mouse, track ball, pen device, or the like, permits selection and manipulation of objects on the display device. In this manner, these input devices support manual user input for any process running on the system.

The computer system 1100 displays text and/or graphic images and other data on the display device 1105. The video adapter 1104, which is interposed between the display 1105 and the system's bus, drives the display device 1105. The video adapter 1104, which includes video memory accessible to the CPU 1101, provides circuitry that converts pixel data stored in the video memory to a raster signal suitable for use by a cathode ray tube (CRT) raster or liquid crystal display (LCD) monitor. A hard copy of the displayed information, or other information within the system 1100, may be obtained from the printer 1117, or other output device.

The system itself communicates with other devices (e.g., other computers) via the network interface card (NIC) 1111 connected to a network (e.g., Ethernet network, Bluetooth wireless network, or the like). The system 1100 may also communicate with local occasionally connected devices (e.g., serial cable-linked devices) via the communication (COMM) interface 1110, which may include a RS-232 serial port, a Universal Serial Bus (USB) interface, or the like. Devices that will be commonly connected locally to the interface 1110 include laptop computers, handheld organizers, digital cameras, and the like.

An implementation of the present invention may also be executed in a Web environment, where software installation packages are downloaded using a protocol such as the HyperText Transfer Protocol (HTTP) from a Web server to one or more target computers (devices, objects) that are connected through the Internet. Alternatively, an implementation of the present invention may be executing in a hosted environment with the functionality described herein presented via a browser interface. Configurations for the environment include a client/server network, as well as a multi-tier environment. Furthermore, it may happen that the client and server of a particular installation both reside in the same physical device, in which case a network connection is not required. (Thus, a potential target system being interrogated may be the local device on which an implementation of the present invention is implemented.)

While there have been described above the principles of the present invention in conjunction with a Predictive Vector Guide For Construction Cost Estimation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

The invention claimed is:

1. A computer implemented method, comprising:
   accessing, for a plurality of objects, vector-based data available for display on a user interface, wherein the vector-based data includes path data for each of the plurality of objects;
   determining a cursor location of a cursor within the vector-based data on the user interface wherein the cursor includes a sense area encompassing the cursor location;
   collecting path data of each respective object;
   forming a point-map-to-line-segment array from the collected path data of each respective object wherein the point-map-to-line-segment array includes one or more points from the collected path data and identifies one or more line segments from the collected path data with each point and wherein each line segment is a clamped line segment that includes two end points from the collected path data;
   identifying a current best point-on-line based on proximity of the sense area to a locus of points associated with one of the one or more line segments; and
   snapping the sense area to the current best point-on-line on the user interface based on a selected mode of operation.

2. The computer implemented method of claim 1, wherein responsive to the selected mode of operation being point snap mode, the cursor is snapped to the current best point-on-line.

3. The computer implemented method of claim 1, wherein responsive to the selected mode of operation being line snap mode, the cursor is snapped to an endpoint of the line segment associated with the current best point-on-line.

4. The computer implemented method of claim 1, further comprising identifying a candidate best point-on-line associated with a candidate line segment within the sense area based on a comparison of proximity of the cursor location to the candidate best point-on-line and proximity of the cursor location to the current best point-on-line, and responsive to proximity of the cursor location to the candidate best point-on-line being less than proximity of the cursor location to the current best point-on-line, replacing the current best point-on-line with the candidate best point-on-line.

5. The computer implemented method of claim 1, further comprising identifying one or more bounding boxes surrounding the cursor based on the cursor location.

6. The computer implemented method of claim 1, wherein the one or more points of each object is an end point.

7. The computer implemented method of claim 1, further comprising storing the current best point-on-line in a snap point collection array.

8. The computer implemented method of claim 1, further comprising identifying a snap end point closest to the current best point-on-line from the two end points of the line segment associated with the current best point-on-line.

9. The computer implemented method of claim 8, further comprising ordering the two end points of the line segment associated with the current best point-on-line and storing the snap end point in a snap point collection array.

10. The computer implemented method of claim 9, further comprising retrieving, from the point-map-to-line-segment array, end points of other line segments associated with the snap end point.

11. The computer implemented method of claim 10, further comprising predicting a next end point based on proximity of the cursor location with end points of other line segments associated with the snap end point.

12. The computer implemented method of claim 11, further comprising snapping the cursor on the user interface to the next end point, linking the next end point and its associated line segment to the snap end point and storing the next end point and both end points of the associated line segment in the snap point collection array.

13. The computer implemented method of claim 1, further comprising snapping the cursor on the user interface to the snap end point and storing the snap end point in a snap point collection array.

14. The computer implemented method of claim 1, responsive to committing to the current best point-on-line, further comprising snapping the cursor to the current best point-on-line and storing the current best point-on-line, and both end points of the associated line segment in a snap point collection array.

15. The computer implemented method of claim 1, further comprising determining a best line segment from the current best point-on-line.

16. A computer program product embodied on a non-transitory computer-readable storage medium and comprising instructions that, when executed by at least one computing device, is configured to cause the at least one computing device to:
access, for a plurality of objects, vector-based data available for display on a user interface, wherein the vector-based data includes path data for each of the plurality of objects;
determine a cursor location of a cursor within the vector-based data on the user interface wherein the cursor includes a sense area encompassing the cursor location;
collect path data of each respective object;
form a point-map-to-line-segment array from the collected path data of each respective object wherein the point-map-to-line-segment array includes one or more points from the collected path data and identifies one or more line segments from the collected path data with each point and wherein each line segment is a clamped line segment that includes two end points from the collected path data;
identify a current best point-on-line based on proximity of the sense area to a locus of points associated with one of the one or more line segments; and
snap the sense area to the current best point-on-line on the user interface based on a selected mode of operation.

17. The computer program product of claim 16, wherein responsive to the selected mode of operation being point snap mode, the cursor is snapped to the current best point-on-line.

18. The computer program product of claim 16, further comprising instructions that cause the at least one computing device to identify a candidate best point-on-line associated with one or more line segments within the sense area based on a comparison of proximity of the cursor location to the candidate best point-on-line and proximity of the cursor location to a current best point-on-line, and responsive to proximity of the cursor location to the candidate best point-on-line being less than proximity of the cursor location to the current best point-on-line, replace the current best point-on-line with the candidate best point-on-line.

19. The computer program product of claim 16, wherein responsive to the selected mode of operation being line snap mode, the cursor is snapped to an endpoint of the line segment associated with the current best point-on-line.

20. The computer program product of claim 16, further comprising instructions that cause the at least one computing device to identify one or more bounding boxes surrounding the cursor based on the cursor location.

21. The computer program product of claim 16, wherein the one or more points of each object is an end point.

22. The computer program product of claim 16, further comprising instructions that cause the at least one computing device to store current best point-on-line in a snap point collection array.

23. The computer program product of claim 16, further comprising instructions that cause the at least one computing device to identify a snap end point closest to the current best point-on-line from the two end points of the line segment associated with the current best point-on-line.

24. The computer program product of claim 23, further comprising instructions that cause the at least one computing device to order the two end points of the line segment associated with the current best point-on-line and store the snap end point in a snap point collection array.

25. The computer program product of claim 24, further comprising instructions that cause the at least one computing device to retrieve, from the point-map-to-line-segment array, end points of other line segments associated with the snap end point.

26. The computer program product of claim 25, further comprising instructions that cause the at least one computing device to predict a next end point based on proximity of the cursor location with end points of other line segments associated with the snap end point.

27. The computer program product of claim 26, further comprising instructions that cause the at least one computing device to snap the cursor on the user interface to the next end point, link the next end point and its associated line segment to the snap end point and store the next end point and both end points of the associated line segment in the snap point collection array.

28. The computer program product of claim 16, further comprising instructions that cause the at least one computing device to snap the cursor on the user interface to the snap end point and store the snap end point in a snap point collection array.

29. The computer program product of claim 16, responsive committing by a user to the current best point-on-line, further comprising instructions that cause the at least one computing device to snap the cursor to the current best point-on-line and store the current best point-on-line, and both end points of the associated line segment in a snap point collection array.

30. The computer program product of claim 16, further comprising instructions that cause the at least one computing device to determine a best line segment from the current best point-on-line.

* * * * *